(12) United States Patent
Yamamoto et al.

(10) Patent No.: US 10,469,089 B2
(45) Date of Patent: Nov. 5, 2019

(54) OSCILLATION CIRCUIT, CIRCUIT DEVICE, OSCILLATOR, ELECTRONIC APPARATUS, AND VEHICLE

(71) Applicant: Seiko Epson Corporation, Tokyo (JP)

(72) Inventors: Takehiro Yamamoto, Matsumoto (JP); Masayuki Ishikawa, Suwa (JP)

(73) Assignee: Seiko Epson Corporation (JP)

( * ) Notice: Subject to any disclaimer, the term of this patent is extended or adjusted under 35 U.S.C. 154(b) by 76 days.

(21) Appl. No.: 15/814,951

(22) Filed: Nov. 16, 2017

(65) Prior Publication Data
US 2018/0145694 A1 May 24, 2018

(30) Foreign Application Priority Data

Nov. 18, 2016 (JP) .................................. 2016-224883

(51) Int. Cl.
| | | |
|---|---|---|
| *H03L 1/02* | (2006.01) | |
| *H03B 5/04* | (2006.01) | |
| *H03B 5/36* | (2006.01) | |
| *H03H 9/19* | (2006.01) | |
| *H03L 1/04* | (2006.01) | |
| *H03H 9/05* | (2006.01) | |

(52) U.S. Cl.
CPC ............... *H03L 1/025* (2013.01); *H03B 5/04* (2013.01); *H03B 5/362* (2013.01); *H03B 5/368* (2013.01); *H03H 9/19* (2013.01); *H03L 1/023* (2013.01); *H03L 1/04* (2013.01); *H03H 9/0547* (2013.01)

(58) Field of Classification Search
CPC ...................................................... H03L 1/025
USPC ....................................................... 331/176
See application file for complete search history.

(56) References Cited

U.S. PATENT DOCUMENTS

| | | | | |
|---|---|---|---|---|
| 6,522,212 B1* | 2/2003 | Kodim | ..................... | H03B 5/04 331/116 R |
| 9,106,237 B2 | 8/2015 | Ishikawa et al. | | |
| 2014/0091868 A1* | 4/2014 | Ishikawa | ................ | H03B 9/145 331/107 DP |
| 2014/0292423 A1* | 10/2014 | Isohata | ................... | H03L 1/025 331/70 |
| 2015/0084711 A1* | 3/2015 | Itasaka | ................... | H03B 5/362 331/360 |
| 2015/0145611 A1 | 5/2015 | Ito et al. | | |

\* cited by examiner

FOREIGN PATENT DOCUMENTS

| | | |
|---|---|---|
| JP | 2014-072623 A | 4/2014 |
| JP | 2015-104074 A | 6/2015 |

*Primary Examiner* — Joseph Chang

(74) *Attorney, Agent, or Firm* — Harness, Dickey & Pierce, P.L.C.

(57) ABSTRACT

An oscillation circuit includes an amplification circuit that causes a resonator to oscillate, and a variable capacitance circuit whose capacitance value is controlled on the basis of a control voltage. The variable capacitance circuit includes a first variable capacitive element in which an inflection point voltage in a change characteristic of a capacitance value for the control voltage is a first voltage, and a second variable capacitive element in which an inflection point voltage in a change characteristic of a capacitance value for the control voltage is a second voltage which is different from the first voltage. A capacitance value of the first variable capacitive element when the control voltage is the first voltage is different from a capacitance value of the second variable capacitive element when the control voltage is the second voltage.

22 Claims, 16 Drawing Sheets

OSCILLATION CIRCUIT, CIRCUIT DEVICE, OSCILLATOR, ELECTRONIC APPARATUS, AND VEHICLE

BACKGROUND

1. Technical Field

The present disclosure relates to an oscillation circuit, a circuit device, an oscillator, an electronic apparatus, and a vehicle.

2. Related Art

In an oscillator such as a temperature compensated crystal oscillator (TCXO), temperature compensation of compensating for a temperature characteristic of an oscillation frequency of a resonator is performed. In other words, an oscillation frequency of the resonator changes according to a temperature, and a control voltage for an oscillation circuit is changed so that the change in the oscillation frequency is reduced. In this case, for example, a change range of an oscillation frequency (oscillation frequency deviation) with respect to a temperature range defined in a specification or the like is defined, and an oscillation frequency (oscillation frequency deviation) preferably linearly changes with predetermined sensitivity with respect to a control voltage within the change range.

As the related art of such temperature compensation, for example, there are techniques disclosed in JP-A-2015-104074 and JP-A-2014-072623. In JP-A-2015-104074 and JP-A-2014-072623, a plurality of variable capacitive elements in which inflection point voltages in change characteristics of a capacitance value for a control voltage are different from each other are provided in an oscillation circuit, and a temperature characteristic of an oscillation frequency is compensated for by using a combined capacitance of the plurality of variable capacitive elements.

In such an oscillator described above, it is desirable to secure a range in which an oscillation frequency linearly changes with respect to a control voltage. For example, in a case where it is necessary to cope with a wide temperature range in an on-vehicle application or the like, a change range of an oscillation frequency of a resonator becomes wider than in a case of coping with a temperature range in a general electronic apparatus or the like. Thus, it is necessary to secure a range in which an oscillation frequency linearly changes with respect to a control voltage so that the change range of the oscillation frequency can be covered.

In the above JP-A-2015-104074 and JP-A-2014-072623, capacitance values of the respective variable capacitive elements at the inflection point voltages are the same as each other, and thus there is concern that a range in which an oscillation frequency linearly changes with respect to a control voltage may not be sufficiently secured. For example, there is a probability that the sensitivity of a capacitance value change for a control voltage may be reduced on a side where a value of a combined capacitance is greater, and thus the sensitivity of an oscillation frequency change for the control voltage may be reduced. Therefore, there is a probability that the linearity of the oscillation frequency change for the control voltage may not be secured on the side where a value of the combined capacitance is greater.

SUMMARY

An advantage of some aspects of the invention is to provide an oscillation circuit, a circuit device, an oscillator, an electronic apparatus, and a vehicle capable of securing a range in which an oscillation frequency linearly changes with respect to a control voltage.

The invention can be implemented as the following forms or embodiments.

An aspect of the invention relates to an oscillation circuit including an amplification circuit that causes a resonator to oscillate; and a variable capacitance circuit whose capacitance value is controlled on the basis of a control voltage, in which the variable capacitance circuit includes a first variable capacitive element in which an inflection point voltage in a change characteristic of a capacitance value for the control voltage is a first voltage, and a second variable capacitive element in which an inflection point voltage in a change characteristic of a capacitance value for the control voltage is a second voltage which is different from the first voltage, and in which a capacitance value of the first variable capacitive element when the control voltage is the first voltage is different from a capacitance value of the second variable capacitive element when the control voltage is the second voltage.

According to the aspect of the invention, capacitance values of the first and second variable capacitive elements are controlled on the basis of the control voltage, and thus an oscillation frequency in the oscillation circuit is controlled. A capacitance value of the first variable capacitive element when the control voltage is an inflection point voltage (first voltage) in a change characteristic of the capacitance value of the first variable capacitive element is different from a capacitance value of the second variable capacitive element when the control voltage is an inflection point voltage (second voltage) in a change characteristic of the capacitance value of the second variable capacitive element. Consequently, it is possible to secure a range in which an oscillation frequency changes linearly for the control voltage compared with a case where capacitance values of the first and second variable capacitive elements at inflection point voltages are the same as each other.

In the aspect of the invention, the first variable capacitive element may be formed of n (where n is an integer of two or more) unit transistors, and the second variable capacitive element may be formed of m (where m is an integer of two or more and is different from n) unit transistors.

As mentioned above, the first and second variable capacitive elements are formed of the unit transistors of different numbers, and thus capacitance values of the first and second variable capacitive elements at inflection point voltages in change characteristics of capacitance values for the control voltage can be made different from each other.

In the aspect of the invention, the first variable capacitive element may be formed of a transistor having a first transistor size, and the second variable capacitive element may be formed of a transistor having a second transistor size which is different from the first transistor size.

As mentioned above, also in a case where the first and second variable capacitive elements are formed of transistors having different transistor sizes, capacitance values of the first and second variable capacitive elements at inflection point voltages in change characteristics of capacitance values for the control voltage can be made different from each other.

In the aspect of the invention, in each of the first variable capacitive element and the second variable capacitive element, the control voltage may be supplied to one of a first node which is a gate node and a second node which is a node of a source and a drain, and a reference voltage may be supplied to the other of the first node and the second node.

A capacitance value between the gate node and the node of the source and the drain of each of the first and second variable capacitive elements changes according to a potential difference therebetween. In other words, since the reference voltage is supplied to one of the gate node and the node of the source and the drain, and the control voltage is supplied to the other node, capacitance values of the first and second variable capacitive elements can be controlled to be variable by using a difference between the reference voltage and the control voltage.

In the aspect of the invention, the first variable capacitive element may be a capacitive element having one end to which the control voltage is supplied and the other end to which a first reference voltage is supplied, and the second variable capacitive element may be a capacitive element having one end to which the control voltage is supplied and the other end to which a second reference voltage which is different from the first reference voltage is supplied.

In the above-described way, a difference between the first reference voltage and the control voltage, which is a potential difference between both ends of the first variable capacitive element can be made different from a difference between the second reference voltage and the control voltage, which is a potential difference between both ends of the second variable capacitive element. Consequently, inflection point voltages in change characteristics of capacitance values for the control voltage can be made different from each other by using the first and second variable capacitive elements.

In the aspect of the invention, the first variable capacitive element may be a capacitive element having a first characteristic as a potential difference-capacitance value characteristic which is a change characteristic of a capacitance value for a potential difference between one end and the other end thereof, and the second variable capacitive element may be a capacitive element having a second characteristic which is different from the first characteristic as the potential difference-capacitance value characteristic.

As mentioned above, the potential difference-capacitance value characteristics of the first and second variable capacitive elements are made different from each other, and thus inflection point voltages in the potential difference-capacitance value characteristics of the first and second variable capacitive elements can be made different from each other. Consequently, inflection point voltages in change characteristics of capacitance values for the control voltage can be made different from each other by using the first and second variable capacitive elements.

In the aspect of the invention, the first variable capacitive element may be formed of a transistor having a first threshold voltage, and the second variable capacitive element may be formed of a transistor having a second threshold voltage which is different from the first threshold voltage.

A capacitance value of a transistor forming each of the first and second variable capacitive elements changes due to a depletion layer being formed in a channel (semiconductor substrate). Thus, transistors having different threshold voltages have different inflection point voltages in change characteristics of capacitance values for a potential difference between both ends of the variable capacitive element. In other words, the first and second variable capacitive elements are formed of transistors having different threshold voltages, and thus inflection point voltages in potential difference-capacitance value characteristics of the first and second variable capacitive elements can be made different from each other.

In the aspect of the invention, the variable capacitance circuit may further include a third variable capacitive element in which an inflection point voltage in a change characteristic of a capacitance value for the control voltage is a third voltage which is different from the first voltage and the second voltage.

As mentioned above, it is possible to further increase a voltage range in which a combined capacitance changes for the control voltage by using the first, second and third variable capacitive elements having different inflection point voltages in change characteristics of capacitance values for the control voltage. Consequently, it is possible to increase a range in which the frequency deviation changes linearly more than in a case where two variable capacitive elements are provided.

In the aspect of the invention, the first variable capacitive element may be provided at an input node of the amplification circuit, the second variable capacitive element may be provided at an output node of the amplification circuit, and the third variable capacitive element may be provided at one of the input node and the output node of the amplification circuit.

With this configuration, an inflection point voltage in a change characteristic of a capacitance value of the third variable capacitive element for the control voltage can be made the third voltage which is different from the first voltage and the second voltage. In other words, in a case where the third variable capacitive element is provided at the input node of the amplification circuit, the second and third voltages can be made different from each other according to a difference between reference voltages supplied to the input node and the output node of the amplification circuit. The potential difference-capacitance value characteristics of the first and third variable capacitive elements are made different from each other, and thus the first and third voltages can be made different from each other. On the other hand, in a case where the third variable capacitive element is provided at the output node of the amplification circuit, the first and third voltages can be made different from each other according to a difference between reference voltages supplied to the input node and the output node of the amplification circuit. The potential difference-capacitance value characteristics of the second and third variable capacitive elements are made different from each other, and thus the second and third voltages can be made different from each other.

In the aspect of the invention, each of the first variable capacitive element and the second variable capacitive element may be a capacitive element having a first characteristic as a potential difference-capacitance value characteristic which is a change characteristic of a capacitance value for a potential difference between one end and the other end thereof, a capacitance value of the first variable capacitive element may be controlled on the basis of a difference between a first reference voltage and the control voltage, a capacitance value of the second variable capacitive element may be controlled on the basis of a difference between a second reference voltage which is different from the first reference voltage and the control voltage, and the third variable capacitive element may be a capacitive element having a second characteristic which is different from the first characteristic as the potential difference-capacitance value characteristic.

As mentioned above, since a capacitance value of the first variable capacitive element is controlled on the basis of a difference between the first reference voltage and the control voltage, and a capacitance value of the second variable capacitive element is controlled on the basis of a difference between the second reference voltage and the control voltage, inflection point voltages in change characteristics of capacitance values of the first and second variable capacitive elements for the control voltage can be made different from each other. Since a potential difference-capacitance value characteristic of each of the first and second variable capacitive elements is the first characteristic, and a potential difference-capacitance value characteristic of the third variable capacitive element is the second characteristic, inflection point voltages in change characteristics of capacitance values of the first, second and third variable capacitive elements for the control voltage can be made different from each other.

In the aspect of the invention, the variable capacitance circuit may further include a fourth variable capacitive element in which an inflection point voltage in a change characteristic of a capacitance value for the control voltage is a fourth voltage which is different from the first voltage, the second voltage, and the third voltage.

As mentioned above, it is possible to further increase a voltage range in which a combined capacitance changes for the control voltage by using the first, second, third and fourth variable capacitive elements having different inflection point voltages in change characteristics of capacitance values for the control voltage. Consequently, it is possible to increase a range in which the frequency deviation changes linearly more than in a case where two or three variable capacitive elements are provided.

Another aspect of the invention relates to an oscillation circuit for a resonator, including an amplification circuit that causes the resonator to oscillate; and a variable capacitance circuit, in which the variable capacitance circuit includes a first variable capacitive element that has a first potential difference-capacitance value characteristic and is provided at an input node of the amplification circuit and whose capacitance value is controlled on the basis of a difference between a first reference voltage and a variable control voltage, a second variable capacitive element that has the first potential difference-capacitance value characteristic and is provided at an output node of the amplification circuit and whose capacitance value is controlled on the basis of a difference between a second reference voltage which is different from the first reference voltage and the control voltage, and a third variable capacitive element that has a second potential difference-capacitance value characteristic which is different from the first potential difference-capacitance value characteristic and is provided at one of the input node and the output node of the amplification circuit and whose capacitance value is controlled on the basis of a difference between a reference voltage corresponding to the one node of the first reference voltage and the second reference voltage and the control voltage, and, in which, in a case where an inflection point voltage in a change characteristic of a capacitance value of the first variable capacitive element for the control voltage is indicated by V1, an inflection point voltage in a change characteristic of a capacitance value of the second variable capacitive element for the control voltage is indicated by V2, and an inflection point voltage in a change characteristic of a capacitance value of the third variable capacitive element for the control voltage is indicated by V3, a relationship of V1<V2<V3 or V1>V2>V3 may be satisfied.

According to the aspect of the invention, V1 and V2 are different from each other by a difference between the first and second reference voltages, and V1 and V3 are different from each other by a difference between inflection point voltages in potential difference-capacitance value characteristics of the first and third variable capacitive elements. In other words, the difference between the inflection point voltages in the potential difference-capacitance value characteristics of the first and third variable capacitive elements are greater than the difference between the first and second reference voltages. For example, there is concern that a difference between the first and second reference voltages may not secured due to lowering of a power source voltage or the like. In relation to this fact, according to the aspect of the invention, it is possible to secure a difference between the inflection point voltages V1 and V3 in change characteristics of capacitance values of the first and third variable capacitive elements for the control voltage by using a difference between inflection point voltages in potential difference-capacitance value characteristics of the first and third variable capacitive elements. Consequently, it is possible to secure a range in which the frequency deviation changes linearly for the control voltage.

Still another aspect of the invention relates to a circuit device including any one of the oscillation circuits.

Still another aspect of the invention relates to an oscillator including any one of the oscillation circuits; and the resonator.

Still another aspect of the invention relates to an electronic apparatus including any one of the oscillation circuits.

Still another aspect of the invention relates to a vehicle including any one of the oscillation circuits.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, a preferred embodiment of the invention will be described in detail. The present embodiment described below is not intended to improperly limit the content of the invention disclosed in the appended claims, and all constituent elements described in the present embodiment are not essential as solving means of the invention.

1. First Configuration Example of Oscillation Circuit

Figure 1:
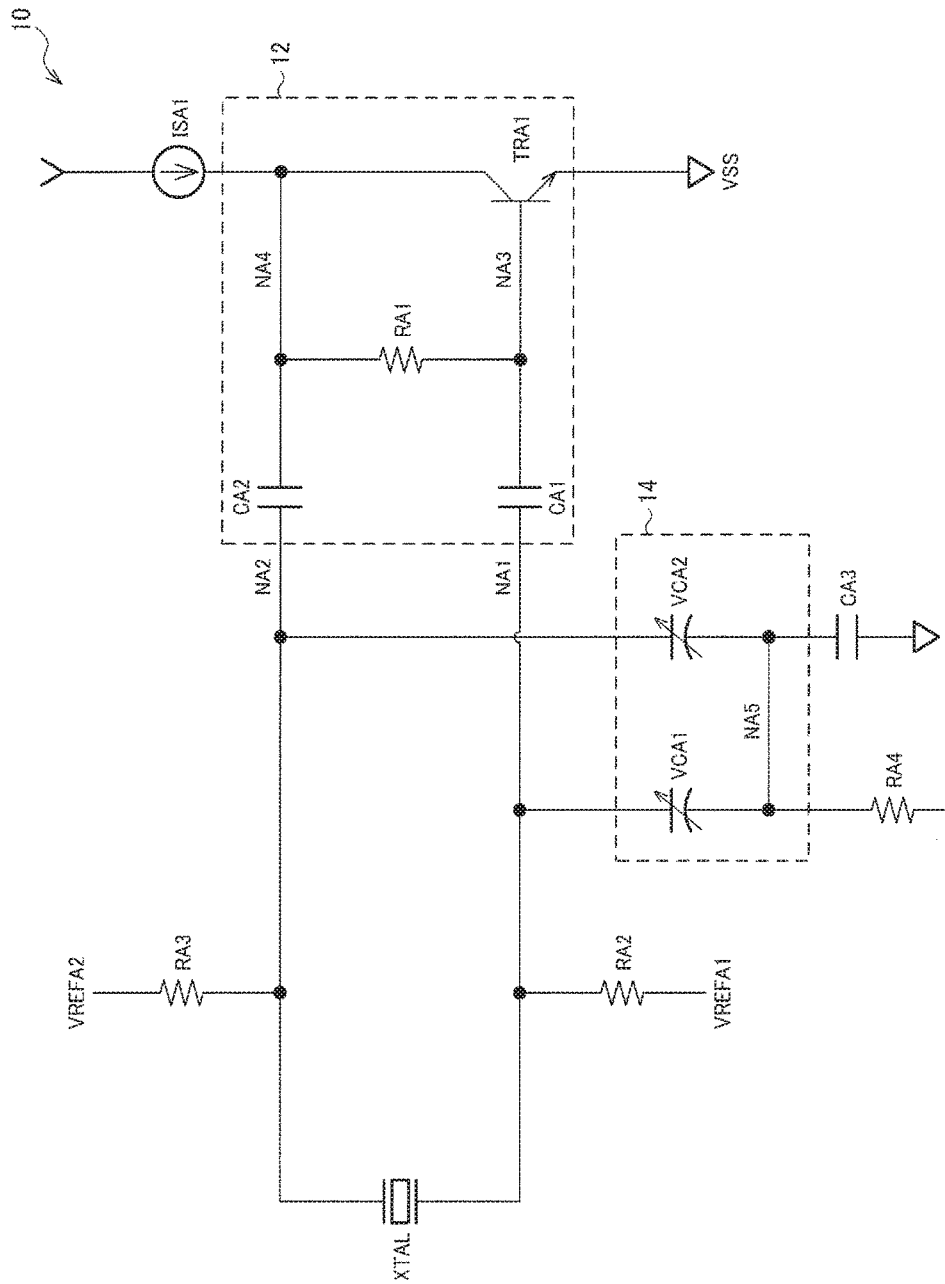
FIG. 1 illustrates a first configuration example of an oscillation circuit of the present embodiment.

FIG. 1 illustrates a first configuration example of an oscillation circuit 10 of the present embodiment. The oscillation circuit 10 is an oscillation circuit of a resonator XTAL. In other words, the oscillation circuit is a circuit for causing the resonator XTAL to oscillate. The oscillation circuit 10 includes an amplification circuit 12 which causes the resonator XTAL to oscillate, and a variable capacitance circuit 14 whose capacitance value is controlled (variable) on the basis of a control voltage VCOMP. The oscillation circuit 10 may include a capacitor CA3, resistive elements RA2 to RA4, and a current source ISA1 (bias current generation circuit). The present embodiment is not limited to the configuration illustrated in FIG. 1, and may be variously modified, for example, some of the constituent elements may be omitted, or other constituent elements may be added thereto.

The amplification circuit 12 includes a bipolar transistor TRA1 (for example, an NPN type), a resistive element RA1, and capacitors CA1 and CA2, and performs negative feedback. Specifically, one end of the resistive element RA1 is connected to a base node NA3 of the bipolar transistor TRA1, and the other end thereof is connected to a collector node NA4 of the bipolar transistor TRA1. A bias current is supplied to the collector node NA4 from the current source ISA1. The current source ISA1 is, for example, a current mirror circuit. An emitter node of the bipolar transistor TRA1 is connected to a node of a low potential side power source VSS.

One end of the capacitor CA1 is connected to the base node NA3, and the other end of the capacitor CA1 is connected to a node NA1 (an input node of the amplification circuit 12) of one end of the resonator XTAL. The collector node NA4 is connected to one end of the capacitor CA2, and the other end of the capacitor CA2 is connected to a node NA2 (an output node of the amplification circuit 12) of the other end of the resonator XTAL. In other words, the negative-feedback amplification circuit 12 is connected to the resonator XTAL via the capacitors CA1 and CA2, and causes the resonator XTAL to oscillate by amplifying an oscillation signal from the resonator XTAL.

The capacitors CA1 and CA2 are capacitors for DC cut, and are provided to set the nodes NA1 and NA2 to reference voltages VREFA1 and VREFA2. Specifically, the node NA1 is connected to one end of the resistive element RA2, and the other end of the resistive element RA2 is connected to a node of the reference voltage VREFA1. The node NA2 is connected to one end of the resistive element RA3, and the other end of the resistive element RA3 is connected to a node of the reference voltage VREFA2. In other words, the reference voltages VREFA1 and VREFA2 are supplied via the resistive elements RA2 and RA3.

The variable capacitance circuit 14 includes a variable capacitive element VCA1 (first variable capacitive element) and a variable capacitive element VCA2 (second variable capacitive element). One end of the variable capacitive element VCA1 is connected to a node NA5, and the other end thereof is connected to the node NA1. One end of the variable capacitive element VCA2 is connected to the node NA5, and the other end thereof is connected to the node NA2. The node NA5 is connected to one end of the resistive element RA4 and one end of the capacitor CA3. The other end of the resistive element RA4 is connected to a node of the control voltage VCOMP. The other end of the capacitor CA3 is connected to the node of the low potential side power source VSS. The variable capacitive elements VCA1 and VCA2 are, for example, MOS capacitors (MOS transistors). In the MOS capacitor, a gate node and a node of a source and a drain (a node in which the source and the drain are short-circuited to each other) are used as nodes at both ends, and a capacitance between both of the ends changes according to a potential difference between both of the ends. In the symbol indicating the variable capacitive element, the linear electrode corresponds to the gate node, and the curved electrode corresponds to the node of the source and the drain.

In the present embodiment, the control voltage VCOMP supplied to one ends of the variable capacitive elements VCA1 and VCA2 is changed, and thus capacitance values of the variable capacitive elements VCA1 and VCA2 (variable capacitance circuit 14) are changed. If the capacitance values of the variable capacitive elements VCA1 and VCA2 are changed, an oscillation frequency in the oscillation circuit 10 is changed. The control voltage VCOMP is a voltage for controlling an oscillation frequency in the oscillation circuit 10, and, for example, may be supplied from a temperature compensation circuit built into a circuit device including the oscillation circuit 10, and may be supplied from the outside of a circuit device including the oscillation circuit 10.

Figure 2:
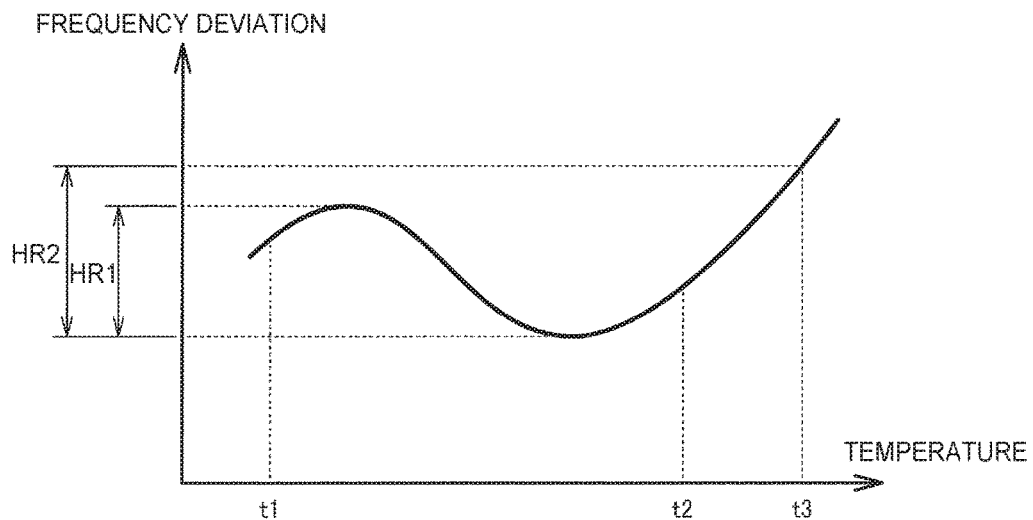
FIG. 2 illustrates an example of a temperature characteristic of an oscillation frequency of a resonator.

FIG. 2 illustrates an example of a temperature characteristic of an oscillation frequency of the resonator XTAL. As illustrated in FIG. 2, if the temperature of the resonator XTAL changes, the deviation of the oscillation frequency changes. The frequency deviation is a quotient of a difference between a reference frequency (for example, a nominal oscillation frequency) and an oscillation frequency to the reference frequency. In an oscillator such as a TCXO performing temperature compensation, the control voltage VCOMP for controlling a frequency on an opposite side with respect to such a temperature characteristic of the frequency deviation is generated, a capacitance value of the variable capacitance circuit 14 is changed by the control voltage VCOMP, and thus the temperature characteristic of the frequency deviation is reduced (canceled).

For example, since the frequency deviation changes in a range of HR1 in a temperature range of t1 to t2, it is necessary to change the frequency deviation in the range (wider range) of the HR1 by using the control voltage VCOMP in order to perform temperature compensation in the temperature range of t1 to t2. If this temperature range is increased to t1 to t3 (where t3>t2), a change range of the frequency deviation is spread to HR2. In other words, in order to perform temperature compensation in a wider temperature range, it is necessary to change the frequency deviation in a wider range by using the control voltage VCOMP. For example, in an on-vehicle application, a change range of an environmental temperature is often wider than that in applications other than the on-vehicle application.

In the present embodiment, capacitance values at inflection point voltages of change characteristics of capacitance values of the variable capacitive elements VCA1 and VCA2 are made different from each other, and thus it is possible to sufficiently secure a change range of the frequency deviation. Hereinafter, first, a problem will be described by using a comparative example, and then a configuration of the present embodiment will be described.

Figure 3:
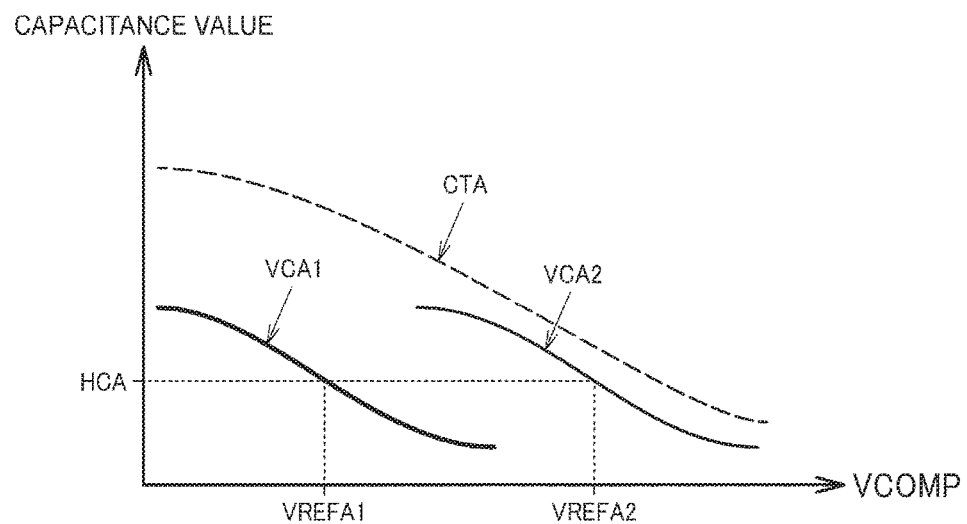
FIG. 3 illustrates a comparative example of a change characteristic of a capacitance value of a variable capacitive element for a control voltage.

FIG. 3 illustrates a comparative example of change characteristics of capacitance values of the variable capacitive elements VCA1 and VCA2 for the control voltage VCOMP. Hereinafter, as an example, a description will be made of a change characteristic of a capacitance value in a case where the control voltage VCOMP is supplied to the node of the source and the drain of the MOS capacitor, but the invention is also applicable to a case where the control voltage VCOMP is supplied to the gate node of the MOS capacitor.

In the example illustrated in FIG. 3, capacitance values of the variable capacitive elements VCA1 and VCA2 have change characteristics in which inflection points are formed when a potential difference between both ends is zero. In other words, in change characteristics for the control voltage VCOMP, an inflection point voltage in a change characteristic of a capacitance value of the variable capacitive element VCA1 is the reference voltage VREFA1, and an inflection point voltage in a change characteristic of a capacitance value of the variable capacitive element VCA2 is the reference voltage VREFA2. As mentioned above, the reference voltages VREFA1 and VREFA2 supplied to the other ends of the variable capacitive elements VCA1 and VCA2 are made different from each other, and thus change characteristics for the control voltage VCOMP supplied to one ends thereof can be shifted. The inflection point voltage is a voltage at which a bent direction (downward convex or upward convex) of a curve of a change characteristic changes, and a sign of a second derivative of the change characteristic changes.

The reference sign CTA in FIG. 3 indicates a change characteristic of a combined capacitance obtained by adding capacitance values of the variable capacitive elements VCA1 and VCA2 together. Capacitances of two variable capacitive elements whose change characteristics are shifted are combined with each other, and thus a capacitance value of the variable capacitance circuit can be changed in a voltage range wider than in a case of using a single variable capacitive element. A change range of a capacitance value is widened, and thus a change range of the frequency deviation can be widened.

In the comparative example, capacitance values at the inflection point voltages are a capacitance value HCA which is the same (including substantially the same) in the two variable capacitive elements VCA1 and VCA2. In other words, inclinations of change characteristics at the inflection point voltages are the same as each other in the two variable capacitive elements VCA1 and VCA2. Thus, inclinations of the change characteristic CTA of a combined capacitance are the same as each other when the control voltage VCOMP is the reference voltage VREFA1 and when the control voltage VCOMP is the reference voltage VREFA2.

Figure 4:
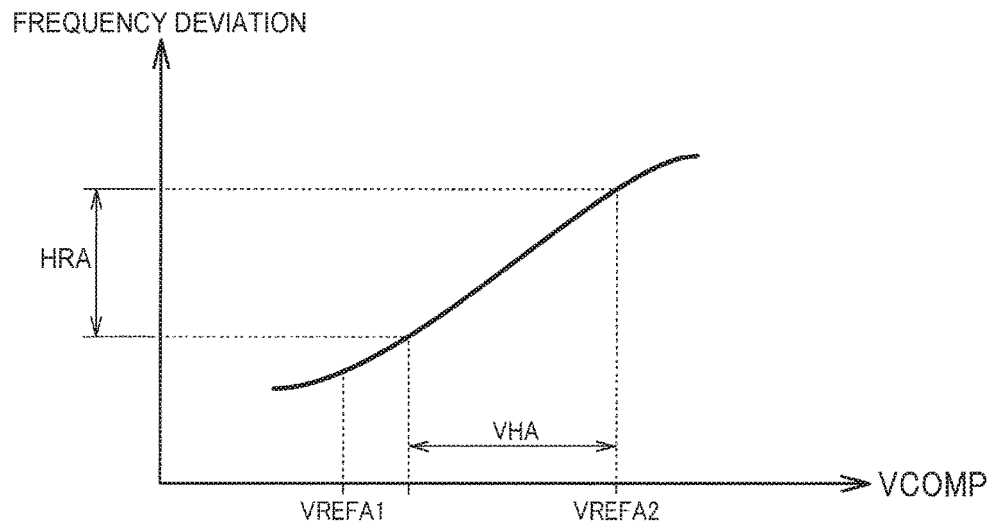
FIG. 4 illustrates a comparative example of a change characteristic of deviation of an oscillation frequency for a control voltage.
Figure 5:
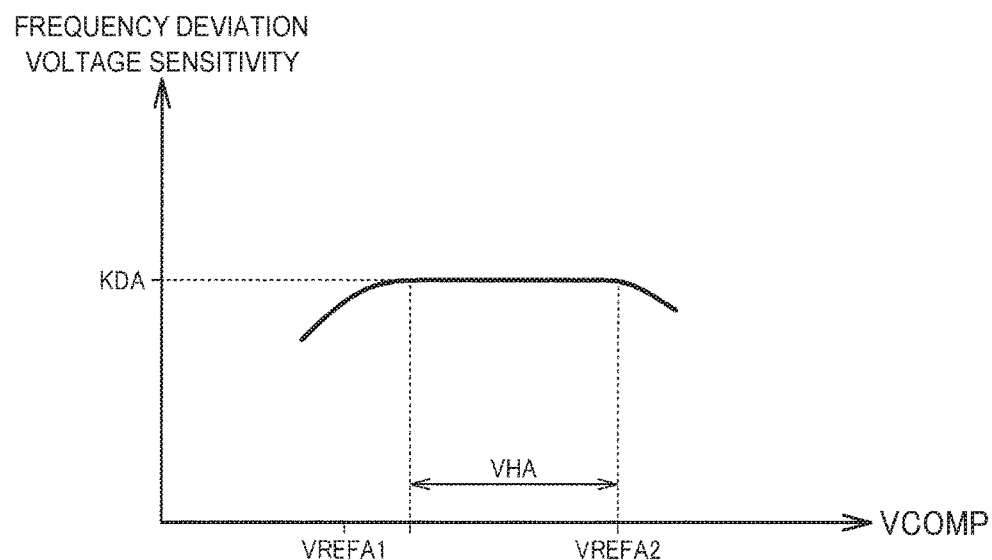
FIG. 5 illustrates a comparative example of a change characteristic of voltage sensitivity of frequency deviation for a control voltage.

FIG. 4 illustrates a comparative example of a change characteristic of deviation of an oscillation frequency for the control voltage VCOMP. In other words, the change characteristic is a change characteristic of the frequency deviation in a case where the change characteristic of a capacitance value in FIG. 3 is applied to the oscillation circuit 10 in FIG. 1. FIG. 5 illustrates a comparative example of a change characteristic of voltage sensitivity of the frequency deviation for the control voltage VCOMP. In other words, the change characteristic corresponds to an inclination (first derivative) of the change characteristic of the frequency deviation in FIG. 4.

As illustrated in FIGS. 4 and 5, an inclination of the change characteristic of the frequency deviation in a range VHA of the control voltage VCOMP is substantially constant (voltage sensitivity KDA). Since the voltage sensitivity is preferably constant in a change range of the frequency deviation required for temperature compensation, a change range HRA of the frequency deviation corresponding to the range VHA of the control voltage VCOMP is used for temperature compensation. In the comparative example, as described in FIG. 3, inclinations of the change characteristic CTA of a combined capacitance when the control voltage VCOMP is the reference voltages VREFA1 and VREFA2 are substantially the same as each other. In a case where a combined capacitance is large, a greater capacitance change is required in order to change the frequency deviation, but an inclination of the capacitance change is constant, and thus the voltage sensitivity of the frequency deviation is hardly secured on a side where the combined capacitance is larger (the reference voltage VREFA1 side). Thus, in a case of trying to cope with a wide temperature range in an on-vehicle application or the like, in the comparative example, there is concern that a range in which a change characteristic of the frequency deviation is linear (the voltage sensitivity is constant) may not be sufficiently secured.

Figure 6:
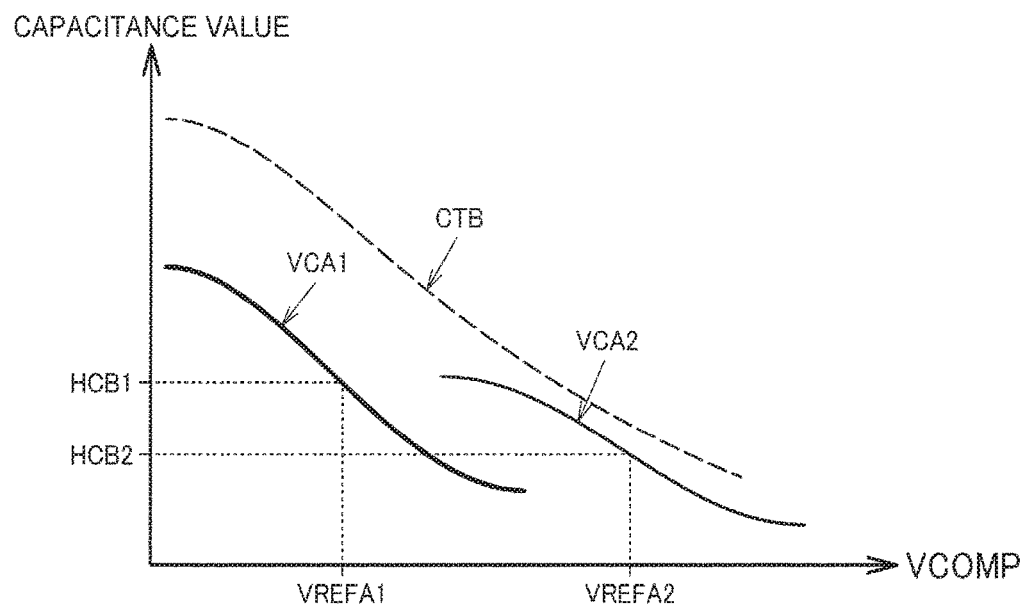
FIG. 6 illustrates a change characteristic of a capacitance value of a variable capacitive element for a control voltage in the present embodiment.

Hereinafter, a description will be made of a configuration of the present embodiment capable of solving this problem. FIG. 6 illustrates change characteristics of capacitance values of the variable capacitive elements VCA1 and VCA2 for the control voltage VCOMP in the present embodiment.

As illustrated in FIG. 6, in the variable capacitive element VCA1 (first variable capacitive element), an inflection point voltage in a change characteristic of a capacitance value for the control voltage VCOMP is a first voltage. In the variable capacitive element VCA2 (second variable capacitive element), an inflection point voltage in a change characteristic of a capacitance value for the control voltage VCOMP is a second voltage which is different from the first voltage. A capacitance value HCB1 of the variable capacitive element VCA1 when the control voltage VCOMP is the first voltage is different from a capacitance value HCB2 of the variable capacitive element VCA2 when the control voltage VCOMP is the second voltage.

Figure 9:
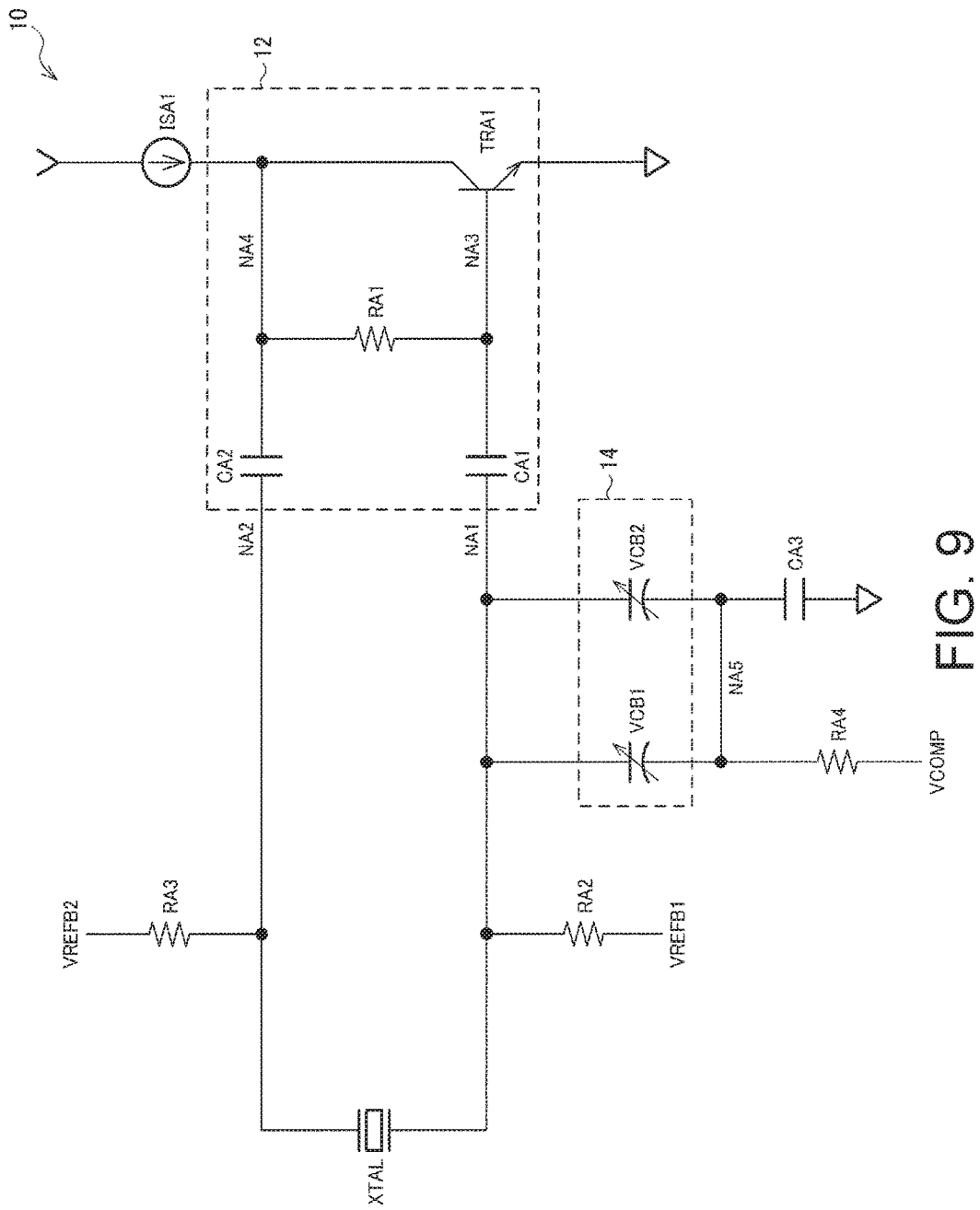
FIG. 9 illustrates a second configuration example of an oscillation circuit of the present embodiment.
Figure 10:
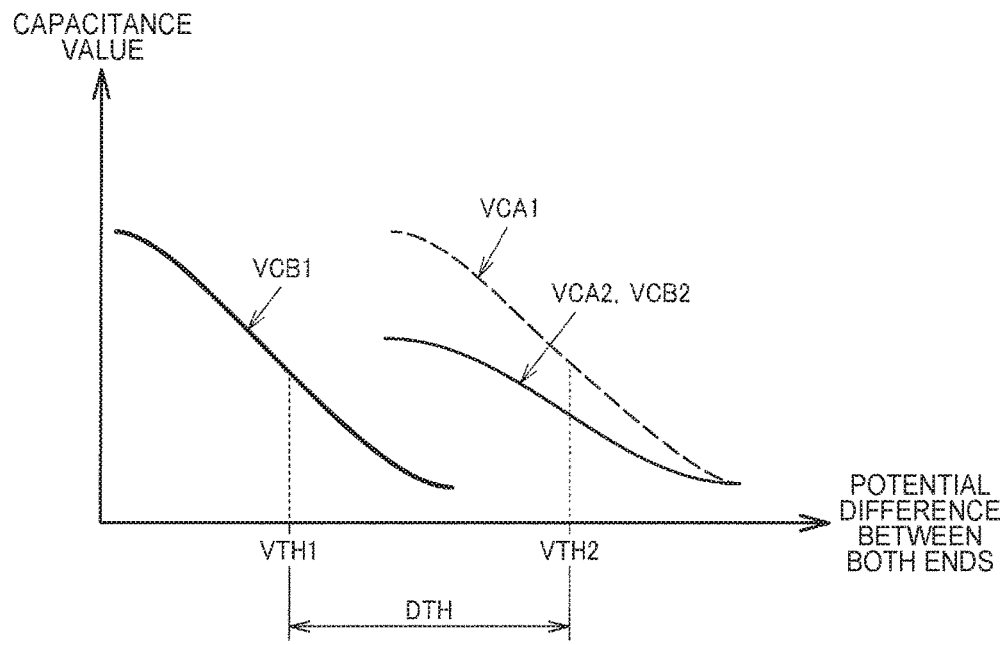
FIG. 10 illustrates a change characteristic of a capacitance value of a variable capacitive element for a potential difference between one end and the other end of the variable capacitive element.
Figure 11:
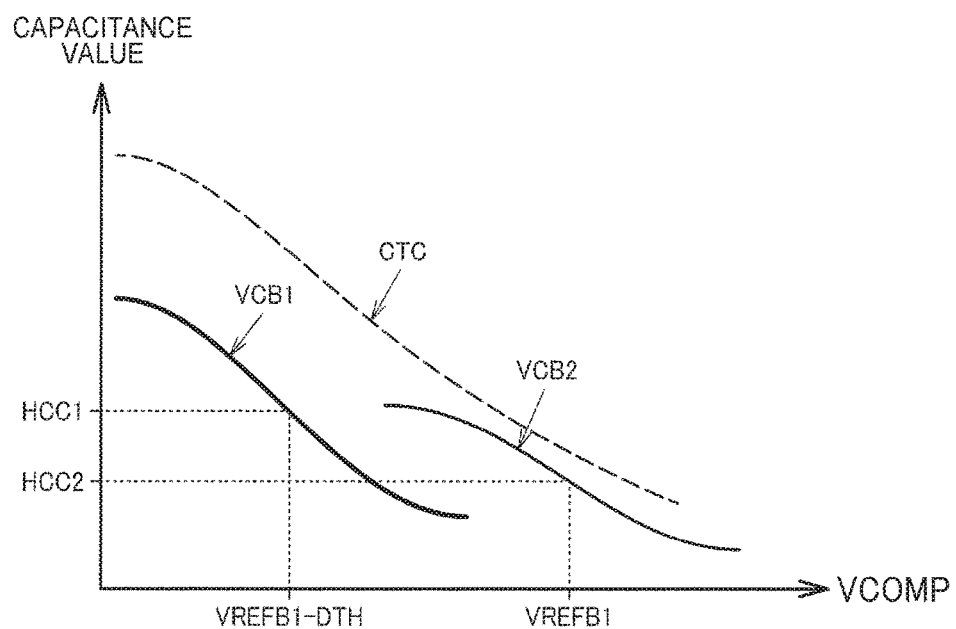
FIG. 11 illustrates a change characteristic of a capacitance value of a variable capacitive element for a control voltage in the second configuration example.

In the example illustrated in FIG. 6, the first voltage is the reference voltage VREFA1, and the second voltage is the reference voltage VREFA2. However, the present embodiment is not limited thereto, and inflection point voltages in change characteristics of capacitance values of the variable capacitive elements VCA1 and VCA2 may be different from each other. For example, in a case where a threshold voltage of the MOS capacitor (MOS transistor) forming the variable capacitive elements VCA1 and VCA2 is indicated by VTH, the first voltage which is an inflection point voltage of the variable capacitive element VCA1 may be VREFA1+VTH, and the second voltage which is an inflection point voltage of the variable capacitive element VCA2 may be VREFA2+VTH. Alternatively, as illustrated in FIGS. 9 to 11, threshold voltages of the variable capacitive elements VCA1 and VCA2 may be made different from each other so that the first and second voltages which are inflection point voltages are different from each other.

As illustrated in FIG. 6, in a case where a change characteristic of a capacitance value is inclined right downward (an inclination is negative), the capacitance value HCB1 of the variable capacitive element VCA1 when the control voltage VCOMP is the first voltage (VREFA1) is greater than the capacitance value HCB2 of the variable capacitive element VCA2 when the control voltage VCOMP is second voltage (VREFA2). In a case where a change characteristic of a capacitance value is inclined left downward (an inclination is positive), the capacitance value HCB2 of the variable capacitive element VCA2 when the control voltage VCOMP is the second voltage is greater than the capacitance value HCB1 of the variable capacitive element VCA1 when the control voltage VCOMP is the first voltage.

As mentioned above, in the present embodiment, a change characteristic of the variable capacitive element VCA1 whose combined capacitance is larger (in the example illustrated in FIG. 6, the control voltage VCOMP is lower) shows that the capacitance value HCB1 at an inflection point voltage is greater. Consequently, in a change characteristic CTB of a combined capacitance, an inclination of the change characteristic can be made greater on a side where a combined capacitance is larger (around VREFA1) than on the combined capacitance is smaller (around VREFA2). Therefore, it is possible to increase a voltage range in which an inclination of a change characteristic of the frequency deviation is linear more than in the comparative example.

Figure 7:
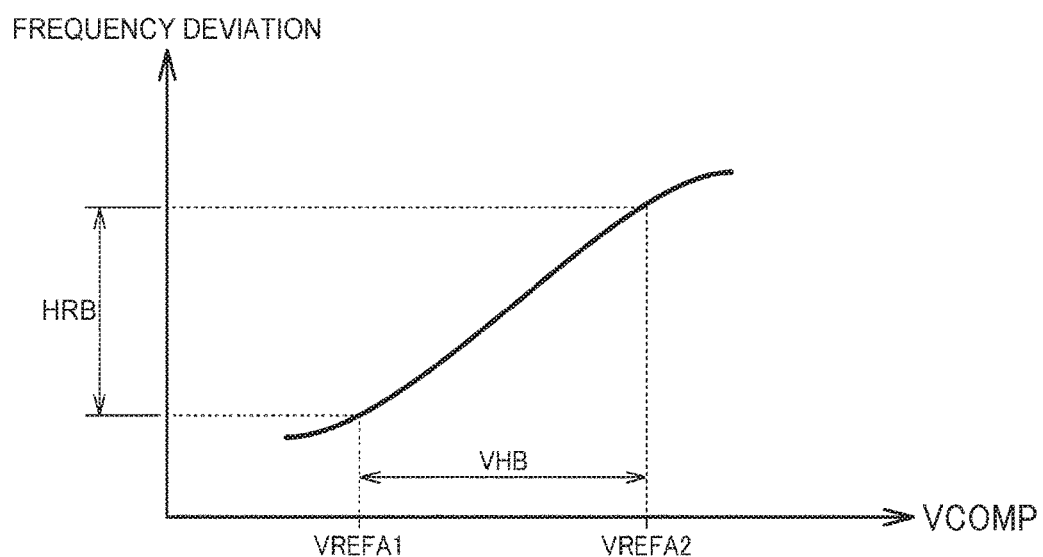
FIG. 7 illustrates a change characteristic of deviation of an oscillation frequency for a control voltage in the present embodiment.
Figure 8:
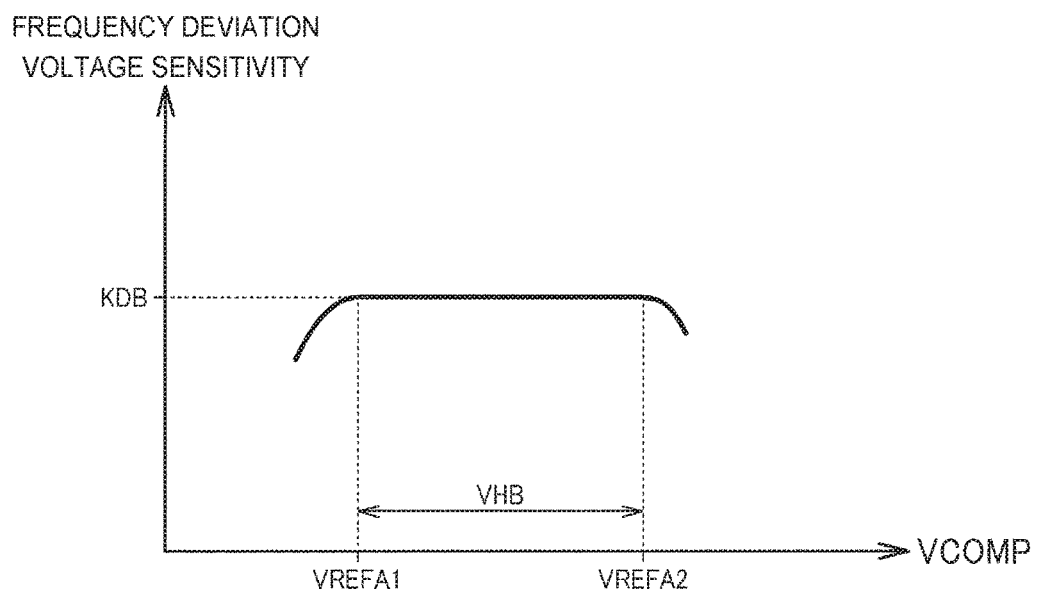
FIG. 8 illustrates a change characteristic of voltage sensitivity of frequency deviation for a control voltage in the present embodiment.

FIG. 7 illustrates a change characteristic of the frequency deviation of an oscillation frequency for the control voltage VCOMP in the present embodiment. In other words, the change characteristic is a change characteristic of the frequency deviation in a case where the change characteristic of the capacitance value in FIG. 6 is applied to the oscillation circuit 10 in FIG. 1. FIG. 8 illustrates a change characteristic of the voltage sensitivity of the frequency deviation for the control voltage VCOMP in the present embodiment. In other words, the change characteristic corresponds to an inclination (first derivative) of the change characteristic of the frequency deviation in FIG. 7.

In the present embodiment, since a greater capacitance change can be obtained on the side where the combined capacitance is larger, it is possible to easily secure the voltage sensitivity of the frequency deviation on the side where the combined capacitance is larger. Therefore, it is possible to increase the range VHB of the control voltage VCOMP causing a change characteristic of the frequency deviation to be linear (the voltage sensitivity is constant) and the change range HRB of the frequency deviation more than in the comparative example. Consequently, in a case of trying to cope with a wide temperature range in an on-vehicle application or the like, it is possible to sufficiently secure a range in which a change characteristic of the frequency deviation is linear (the voltage sensitivity is constant). In FIG. 8, voltage sensitivity KDB of the frequency deviation in the range VHB of the control voltage VCOMP can be made the same as the voltage sensitivity KDA, for example, in the comparative example illustrated in FIG. 5. In other words, it is possible to secure a range in which a change characteristic of the frequency deviation is linear while the voltage sensitivity is maintained to be high.

In the present embodiment, the variable capacitive element VCA1 (first variable capacitive element) is formed of n (where n is an integer of two or more) unit transistors. The variable capacitive element VCA2 (second variable capacitive element) is formed of m (where m is an integer of two or more and is different from n) unit transistors.

For example, in the example illustrated in FIG. 6, n is greater than m. However, the present embodiment is not limited thereto, and n may be smaller than m, for example, in a case where a change characteristic of a capacitance value is inclined right upward (an inclination is positive). Here, the unit transistors forming the variable capacitive elements VCA1 and VCA2 have the same transistor size. A transistor size is a gate size (a channel width and a channel length) of a MOS transistor.

As mentioned above, the variable capacitive elements VCA1 and VCA2 are formed of the unit transistors of different numbers, and thus capacitance values of the variable capacitive elements VCA1 and VCA2 at inflection point voltages in change characteristics of capacitance values for the control voltage VCOMP can be made different from each other. Capacitance values of the variable capacitive elements VCA1 and VCA2 can be set at an accurate ratio by using the unit transistors, and thus it is possible to improve a change characteristic of the frequency deviation (for example, it is possible to reduce a variation in the linearity due to a process variation).

In the present embodiment, the variable capacitive element VCA1 (first variable capacitive element) may be formed of transistors (first transistors) having a first transistor size, and the variable capacitive element VCA2 (second variable capacitive element) may be formed of transistors (second transistors) having a second transistor size which is different from the first transistor size.

As mentioned above, also in a case where the variable capacitive elements VCA1 and VCA2 are formed of transistors having different transistor sizes, capacitance values of the variable capacitive elements VCA1 and VCA2 at inflection point voltages in change characteristics of capacitance values for the control voltage VCOMP can be made different from each other.

In the present embodiment, in the variable capacitive elements VCA1 and VCA2, the control voltage VCOMP is supplied to one of a first node as the gate node and a second node as the node of the source and the drain, and a reference voltage is supplied to the other of the first node and the second node.

In the configuration example illustrated in FIG. 1, the reference voltages VREFA1 and VREFA2 are supplied to the gate nodes of the variable capacitive elements VCA1 and VCA2 (first and second variable capacitive elements), and the control voltage VCOMP is supplied to the nodes of the sources and the drains thereof. The present embodiment is not limited thereto, and, as will be described later in FIG. 16, the control voltage VCOMP may be supplied to the gate nodes of variable capacitive elements VCC1 and VCC2 (first and second variable capacitive elements), and reference voltages VREFC1 and VREFC2 may be supplied to the nodes of the sources and the drains thereof. In the above description, different reference voltages are supplied to the gate nodes of the first and second variable capacitive elements or the nodes of the sources and the drains thereof, but this is only an example, and the same reference voltage may be supplied to the gate nodes of the first and second variable capacitive elements or the nodes of the sources and the drains thereof.

As mentioned above, in the present embodiment, the variable capacitive elements included in the variable capacitance circuit 14 are formed of the MOS capacitors (MOS transistors). A capacitance between the gate node and the node of the source and the drain of the variable capacitive element changes according to a potential difference therebetween. Specifically, a capacitance value changes when a potential difference between both ends of the variable capacitive element substantially becomes a threshold voltage (a threshold voltage of a drain current characteristic for a gate-source voltage) of the MOS transistor. In a characteristic of a capacitance value corresponding to a potential difference obtained by subtracting a potential of the node of the source and the drain from a potential of the gate node, the capacitance value becomes greater in a case where the potential difference is lower than a threshold voltage than in a case where the potential difference is higher than the threshold voltage. It is possible to implement the variable capacitance circuit 14 in which a capacitance value is controlled on the basis of the control voltage VCOMP by using a capacitance value characteristic of the MOS capacitor.

In the present embodiment, the variable capacitive element VCA1 (first variable capacitive element) is a capacitive element having one end to which the control voltage VCOMP is supplied and the other end to which the reference voltage VREFA1 (first reference voltage) is supplied. The variable capacitive element VCA2 (second variable capacitive element) is a capacitive element having one end to which the control voltage VCOMP is supplied and the other end to which the reference voltage VREFA2 (second reference voltage) which is different from the reference voltage VREFA1 is supplied.

For example, as described in FIG. 6, inflection point voltages in change characteristics of capacitance values corresponding to potential differences of both ends of the variable capacitive elements VCA1 and VCA2 are the same as each other. In this case, a difference between inflection point voltages corresponds to a difference between the reference voltages VREFA1 and VREFA2 in terms of a change characteristic of a capacitance value for the control voltage VCOMP. As mentioned above, reference voltages supplied to the other ends of the variable capacitive elements VCA1 and VCA2 are made different from each other, and thus inflection point voltages in change characteristics of capacitance values of the variable capacitive elements VCA1 and VCA2 for the control voltage VCOMP can be made different from each other. Consequently, it is possible to increase a range in which a capacitance value (change characteristic CTB) of the variable capacitance circuit 14 changes for the control voltage VCOMP.

2. Second Configuration Example of Oscillation Circuit

FIG. 9 illustrates a second configuration example of the oscillation circuit 10 of the present embodiment. In the second configuration example, the variable capacitance circuit 14 includes a variable capacitive element VCB1 and a variable capacitive element VCB2. A reference voltage VREFB1 is supplied to one node NA1 of the resonator XTAL, and a reference voltage VREFB2 is supplied to the other node NA2 of the resonator XTAL.

Specifically, one ends of both of the variable capacitive elements VCB1 and VCB2 are connected to the node NA5, and the other ends thereof are connected to the node NA1. In other words, the control voltage VCOMP is supplied to one ends of both of the variable capacitive elements VCB1 and VCB2, and the reference voltage VREFB1 is supplied to the other ends thereof. The reference voltages VREFB1 and VREFB2 are the same voltages as, for example, the reference voltages VREFA1 and VREFA2 in FIG. 1, but are not limited thereto, and may be voltages which are different from the reference voltages VREFA1 and VREFA2.

FIG. 10 illustrates a change characteristic (potential difference-capacitance value characteristic) of a capacitance value of the variable capacitive element for a potential difference between one end and the other end of the variable capacitive element.

The variable capacitive elements VCA1 and VCA2 in the first configuration example have the same potential difference-capacitance value characteristic except for a magnitude difference between capacitance values. In other words, inflection point voltages in change characteristics of capacitance values for potential differences are the same as each other, and capacitance values at the inflection point voltages are different from each other (a change characteristic of the variable capacitive element VCA1 is a predetermined multiple of a change characteristic of the variable capacitive element VCA2).

On the other hand, the variable capacitive element VCB1 (first variable capacitive element) in the second configuration example is a capacitive element whose potential difference-capacitance value characteristic is a first characteristic. The variable capacitive element VCB2 (second variable capacitive element) is a capacitive element whose potential difference-capacitance value characteristic is a second characteristic which is different from the first characteristic. The first and second characteristics are characteristics in which inflection point voltages in the potential difference-capacitance value characteristics are different from each other. As illustrated in FIG. 10, inflection point voltages in the potential difference-capacitance value characteristics of the variable capacitive elements VCB1 and VCB2 are respectively indicated by VTH1 and VTH2, and a difference therebetween is indicated by DTH=|VTH1−VTH2|.

FIG. 11 illustrates change characteristics of capacitance values of the variable capacitive elements VCB1 and VCB2 for the control voltage VCOMP in the second configuration example. FIG. 11 illustrates a case of VTH2=0, but the present embodiment is not limited to VTH2=0.

As described in FIG. 9, the common reference voltage VREFB1 is supplied to the other ends of the variable capacitive elements VCB1 and VCB2. However, as described in FIG. 10, a difference between inflection point voltages in potential difference-capacitance value characteristics is DTH. Consequently, as illustrated in FIG. 11, inflection point voltages in change characteristics of capacitance values of the variable capacitive elements VCB1 and VCB2 for the control voltage VCOMP are different from each other by DTH. In other words, inflection point voltages in change characteristics of capacitance values of the variable capacitive elements VCB1 and VCB2 for the control voltage VCOMP are VREFB1 and VREFB1−DTH.

Capacitance values of the variable capacitive elements VCB1 and VCB2 at the inflection point voltages are respectively HCC1 and HCC2 (for example, HCC1>HCC2). A change characteristic CTC of a combined capacitance of the variable capacitive elements VCB1 and VCB2 has an increasing inclination toward a greater capacitance value. In other words, an inclination of the change characteristic CTC at the inflection point voltage (VREFB1−DTH) is larger than an inclination of the change characteristic CTC at the inflection point voltage (VREFB1). Consequently, in the same manner as in the first configuration example, it is possible to secure a range in which a change characteristic of the frequency deviation is linear while the voltage sensitivity is maintained to be high.

As mentioned above, according to the second configuration example, inflection point voltages in change characteristics of capacitance values of the variable capacitive elements VCB1 and VCB2 for a potential difference are made different from each other, and thus inflection point voltages in change characteristics of capacitance values of the variable capacitive elements VCB1 and VCB2 for the control voltage VCOMP can be made different from each other. Consequently, it is possible to secure a range in which a change characteristic of the frequency deviation is linear.

For example, in a case where a power source voltage is lowered, it may be hard to secure a difference between the reference voltages VREFB1 and VREFB2. In this case, if a change characteristic of a capacitance value of the variable capacitive element for the control voltage VCOMP is shifted at a difference between the reference voltages VREFB1 and VREFB2, there is concern that a range in which a change characteristic of the frequency deviation is linear may not be sufficiently secured. In relation to this fact, in the present embodiment, since change characteristics of capacitance values of the variable capacitive elements VCB1 and VCB2 for a potential difference are made different from each other, it is possible to sufficiently secure a range in which a change characteristic of the frequency deviation is linear without being influenced by a difference between the reference voltages VREFB1 and VREFB2.

In the present embodiment, the variable capacitive element VCB1 (first variable capacitive element) is formed of a transistor (first transistor) having a first threshold voltage. The variable capacitive element VCB2 (second variable capacitive element) is formed of a transistor (second transistor) having a second threshold voltage which is different from the first threshold voltage. The threshold voltage is a threshold voltage of a drain current characteristic for a gate-source voltage. For example, impurity implantation concentrations for a gate (poly-silicon) are made different from each other, and thus threshold voltages can be made different from each other. The transistors having the first and second threshold voltages may be transistors having first and second transistor sizes, and may be formed of n and m unit transistors.

A capacitance value of the MOS capacitor changes due to a depletion layer being formed in a channel (semiconductor substrate). Thus, transistors having different threshold voltages have different inflection point voltages in change characteristics of capacitance values for a potential difference between both ends of the variable capacitive element. In other words, the variable capacitive elements VCB1 and VCB2 are formed of transistors having different threshold voltages, and thus inflection point voltages in potential difference-capacitance value characteristics of the variable capacitive elements VCB1 and VCB2 can be made different from each other.

3. Third Configuration Example of Oscillation Circuit

Figure 12:
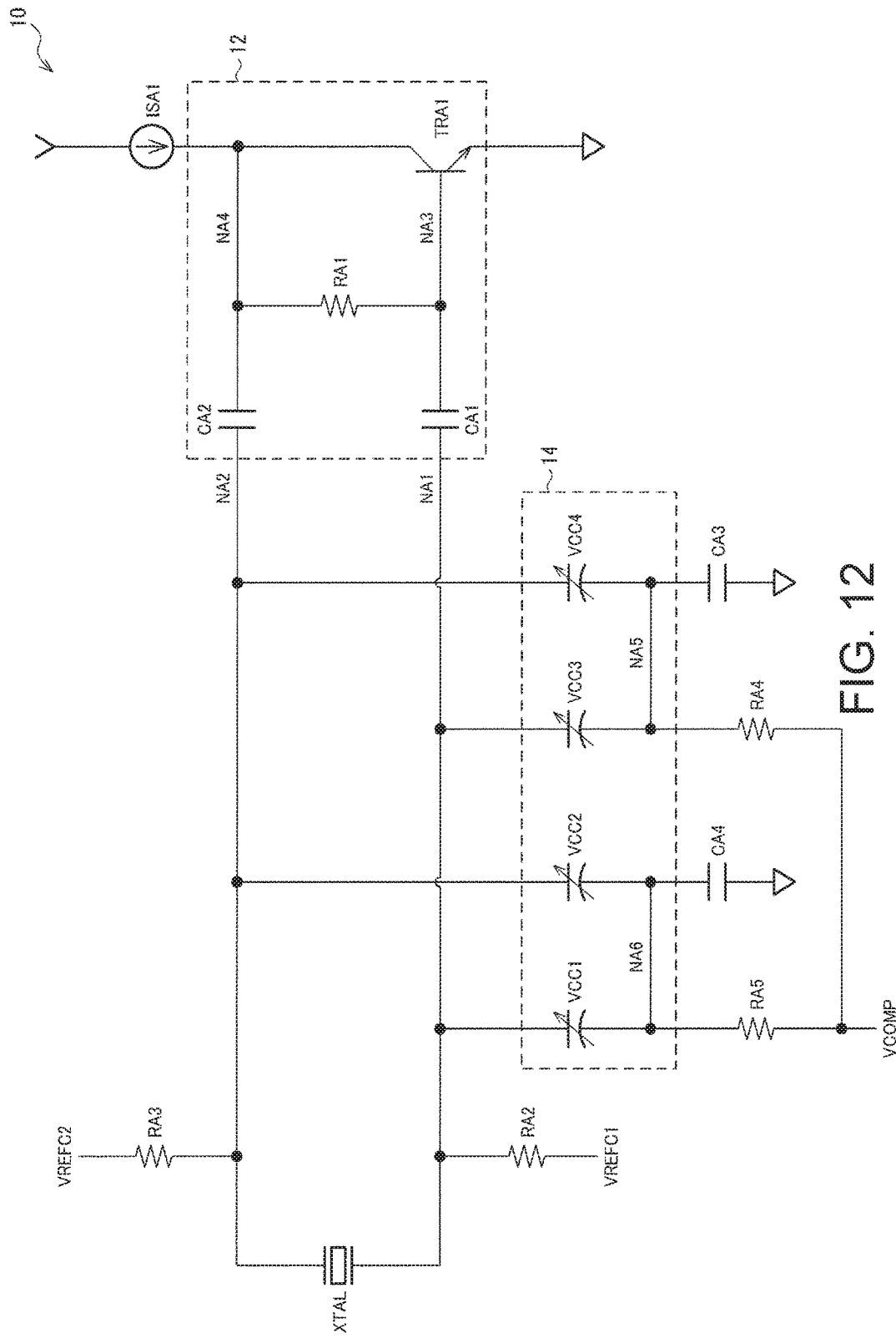
FIG. 12 illustrates a third configuration example of an oscillation circuit of the present embodiment.

FIG. 12 illustrates a third configuration example of the oscillation circuit 10 of the present embodiment. In the third configuration example, the variable capacitance circuit 14 includes variable capacitive elements VCC1, VCC2, VCC3 and VCC4. The oscillation circuit 10 further includes a capacitor CA4 and a resistive element RA5. A reference voltage VREFC1 is supplied to one node NA1 of the resonator XTAL, and a reference voltage VREFC2 is supplied to the other node NA2 of the resonator XTAL.

Specifically, the variable capacitive element VCC1 has one end connected to a node NA6 and the other end connected to the node NA1. The variable capacitive element VCC2 has one end connected to a node NA6 and the other end connected to the node NA2. The variable capacitive element VCC3 has one end connected to the node NA5 and the other end connected to the node NA1. The variable capacitive element VCC4 has one end connected to the node NA5 and the other end connected to the node NA2. The node NA6 is connected to one end of the resistive element RA5 and one end of the capacitor CA4, the other end of the resistive element RA5 is connected to the node of the control voltage VCOMP, and the other end of the capacitor CA4 is connected to the node of the low potential side power source VSS. The node NA5 is connected to one end of the resistive element RA4 and one end of the capacitor CA3, the other end of the resistive element RA4 is connected to the node of the control voltage VCOMP, and the other end of the capacitor CA3 is connected to the node of the low potential side power source VSS.

Figure 13:
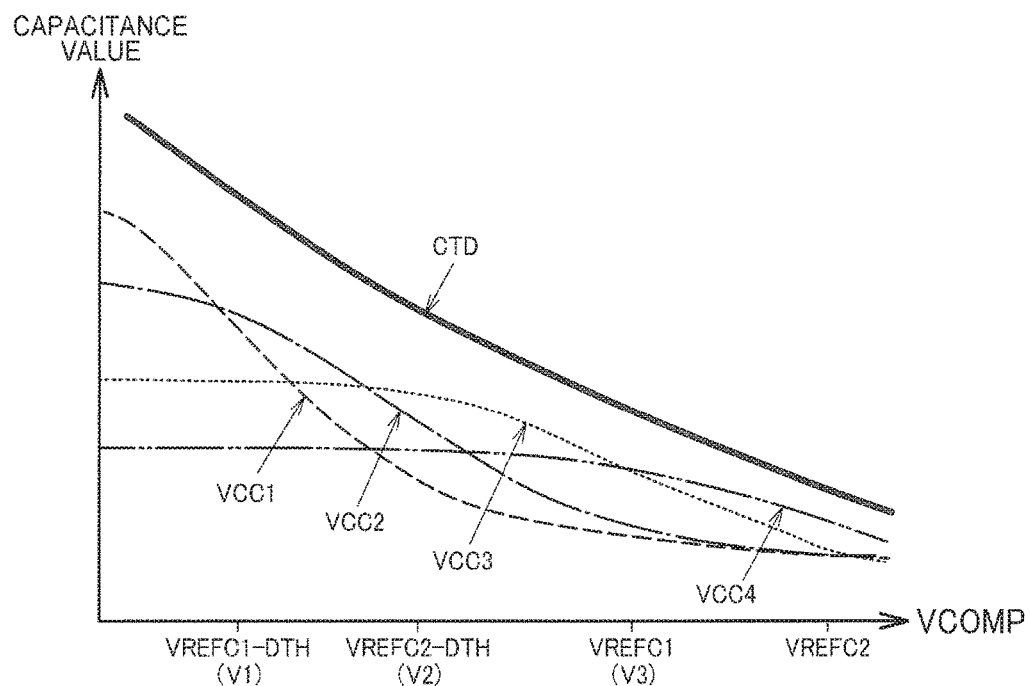
FIG. 13 illustrates a change characteristic of a capacitance value of a variable capacitive element for a control voltage in the third configuration example.

FIG. 13 illustrates change characteristics of capacitance values of the variable capacitive elements VCC1, VCC2, VCC3 and VCC4 for the control voltage VCOMP in the third configuration example.

Inflection point voltages in change characteristics of capacitance values of the variable capacitive elements VCC1 and VCC2 (first and second variable capacitive elements) for the control voltage VCOMP are respectively a first voltage (VREFC1−DTH) and a second voltage (VREFC2−DTH). An inflection point voltage in a change characteristic of a capacitance value of the variable capacitive element VCC3 (third variable capacitive element) for the control voltage VCOMP is a third voltage (VREFC1) which is different from the first voltage and the second voltage. In the example illustrated in FIG. 13, a relationship of the first voltage (VREFC1−DTH)<the second voltage (VREFC2−DTH)<the third voltage (VREFC1) is satisfied. A relationship of a capacitance value of the variable capacitive element VCC1 at the first voltage>a capacitance value of the variable capacitive element VCC2 at the second voltage>a capacitance value of the variable capacitive element VCC3 at the third voltage is satisfied.

As mentioned above, it is possible to further increase a voltage range in which a combined capacitance changes for the control voltage VCOMP by using the three variable capacitive elements VCC1, VCC2 and VCC3 having different inflection point voltages in change characteristics of capacitance values for the control voltage VCOMP. Consequently, it is possible to increase a range in which the frequency deviation changes linearly more than in a case where two variable capacitive elements are provided.

In the present embodiment, the variable capacitive element VCC1 (first variable capacitive element) is provided at the input node NA1 of the amplification circuit 12. The variable capacitive element VCC2 (second variable capacitive element) is provided at the output node NA2 of the amplification circuit 12. The variable capacitive element VCC3 (third variable capacitive element) is provided at the input node NA1 of the amplification circuit 12.

The reference voltage VREFC1 is supplied to the input node NA1 of the amplification circuit 12, and the reference voltage VREFC2 is supplied to the output node NA2 of the amplification circuit 12. In other words, the variable capacitive elements VCC1 and VCC3 and the variable capacitive element VCC2 are provided at nodes with different reference voltages. Consequently, change characteristics of capacitance values of the variable capacitive elements VCC1 and VCC3 for the control voltage VCOMP and a change characteristic of a capacitance value of the variable capacitive element VCC2 for the control voltage VCOMP are shifted by a difference between reference voltages. With respect to the variable capacitive elements VCC1 and VCC3 provided at the nodes with the same reference voltage, inflection point voltages in change characteristics for a voltage difference are made different from each other, and thus a change characteristic of a capacitance value for the control voltage VCOMP can be shifted. In the above-described way, inflection point voltages in change characteristics of capacitance values of the variable capacitive elements VCC1, VCC2 and VCC3 for the control voltage VCOMP can be made different from each other.

The third variable capacitive element may be provided at one of the input node NA1 and the output node NA2 of the amplification circuit 12. For example, in the configuration example illustrated in FIG. 12, the variable capacitive element VCC4 provided at the output node NA2 of the amplification circuit 12 may be the third variable capacitive element. In this case, the variable capacitive element VCC1 and the variable capacitive elements VCC2 and VCC4 are provided nodes with different reference voltages.

In the present embodiment, the variable capacitive elements VCC1 and VCC2 are capacitive elements whose potential difference-capacitance value characteristic is a first characteristic. In other words, the variable capacitive elements VCC1 and VCC2 have the same inflection point voltage in the potential difference-capacitance value characteristics. A capacitance value of the variable capacitive element VCC1 is controlled according to a difference between the reference voltage VREFC1 (first reference voltage) and the control voltage VCOMP. A capacitance value of the variable capacitive element VCC2 is controlled according to a difference between the reference voltage VREFC2 (second reference voltage) which is different from the reference voltage VREFC1 and the control voltage VCOMP. Consequently, inflection point voltages in change characteristics of capacitance values of the variable capacitive elements VCC1 and VCC2 for the control voltage VCOMP can be made different from each other by a difference between the reference voltages VREFC1 and VREFC2. In the example illustrated in FIG. 13, the inflection point voltages are VREFC1−DTH and VREFC2−DTH.

In the present embodiment, the variable capacitive element VCC3 (third variable capacitive element) is a capacitive element whose potential difference-capacitance value characteristic is a second characteristic. In other words, inflection point voltages are different from each other in the potential difference-capacitance value characteristic of the variable capacitive element VCC3 and the potential difference-capacitance value characteristics of the variable capacitive elements VCC1 and VCC2. Consequently, inflection point voltages in change characteristics of capacitance values of the variable capacitive elements VCC1 and VCC2 for the control voltage VCOMP can be made different from an inflection point voltage in a change characteristic of a capacitance value of the variable capacitive element VCC3 for the control voltage VCOMP. For example, in the example illustrated in FIG. 13, inflection point voltages in change characteristics of capacitance values of the variable capacitive elements VCC1, VCC2 and VCC3 for the control voltage VCOMP are VREFC1−DTH, VREFC2−DTH and VREFC1. As described in FIG. 10, DTH indicates a difference between the inflection point voltage in the first characteristic and the inflection point voltage in the second characteristic.

In the present embodiment, the variable capacitive element VCC4 (fourth variable capacitive element) has a fourth voltage (VREFC2) which is different from the first voltage (VREFC1−DTH), the second voltage (VREFC2−DTH), and the third voltage (VREFC1) as an inflection point voltage in a change characteristic of a capacitance value for the control voltage VCOMP. In the example illustrated in FIG. 13, a relationship of the first voltage (VREFC1−DTH)<the second voltage (VREFC2−DTH)<the third voltage (VREFC1) <the fourth voltage (VREFC2) is satisfied. A relationship of a capacitance value of the variable capacitive element VCC1 at the first voltage>a capacitance value of the variable capacitive element VCC2 at the second voltage>a capacitance value of the variable capacitive element VCC3 at the third voltage>a capacitance value of the variable capacitive element VCC4 at the fourth voltage is satisfied.

As mentioned above, it is possible to further increase a voltage range in which a combined capacitance changes for the control voltage VCOMP by using the four variable capacitive elements VCC1, VCC2, VCC3 and VCC4 having different inflection point voltages in change characteristics of capacitance values for the control voltage VCOMP. Consequently, it is possible to increase a range in which the frequency deviation changes linearly more than in a case where two or three variable capacitive elements are provided. Capacitance values at inflection point voltages of the variable capacitive elements VCC1, VCC2, VCC3 and VCC4 are made different from each other, and thus a change characteristic CTD of a value of a combined capacitance can be made a characteristic in which an inclination is increased as a capacitance value becomes greater. Consequently, it is possible to secure a range in which the frequency deviation changes linearly.

In the present embodiment, in a case where an inflection point voltage in a change characteristic of a capacitance value of the variable capacitive element VCC1 (first variable capacitive element) for the control voltage VCOMP is indicated by V1, an inflection point voltage in a change characteristic of a capacitance value of the variable capacitive element VCC2 (second variable capacitive element) for the control voltage VCOMP is indicated by V2, and an inflection point voltage in a change characteristic of a capacitance value of the variable capacitive element VCC3 (third variable capacitive element) for the control voltage VCOMP is indicated by V3, a relationship of V1<V2<V3 or a relationship of V1>V2>V3 is satisfied. For example, in the example illustrated in FIG. 13, there is a relationship that V1=VREFC1−DTH, V2=VREFC2−DTH, and V3=VREFC1, and V1<V2<V3. Alternatively, in an example illustrated in FIG. 17 which will be described later, there is a relationship that V1=VREFD1+DTH, V2=VREFD2+DTH, and V3=VREFD1, and V1>V2>V3.

As an example, in FIGS. 13, V1 and V2 are different from each other by a difference between the reference voltages VREFC1 and VREFC2, and V1 and V3 are different from each other by a difference between inflection point voltages in potential difference-capacitance value characteristics of the variable capacitive elements VCC1 and VCC3. In other words, the difference between the inflection point voltages in the potential difference-capacitance value characteristics of the variable capacitive elements VCC1 and VCC3 is greater than the difference between the reference voltages VREFC1 and VREFC2.

For example, there is concern that a difference between the reference voltages VREFC1 and VREFC2 may not secured due to lowering of a power source voltage. In relation to this fact, according to the present embodiment, it is possible to secure a difference between the inflection point voltages V1 and V3 in change characteristics of capacitance values of the variable capacitive elements VCC1 and VCC3 for the control voltage VCOMP by using a difference between inflection point voltages in potential difference-capacitance value characteristics of the variable capacitive elements VCC1 and VCC3. Consequently, even in a case where a difference between the reference voltages VREFC1 and VREFC2 may not be secured, it is possible to secure a range in which the frequency deviation changes linearly for the control voltage VCOMP.

Figure 14:
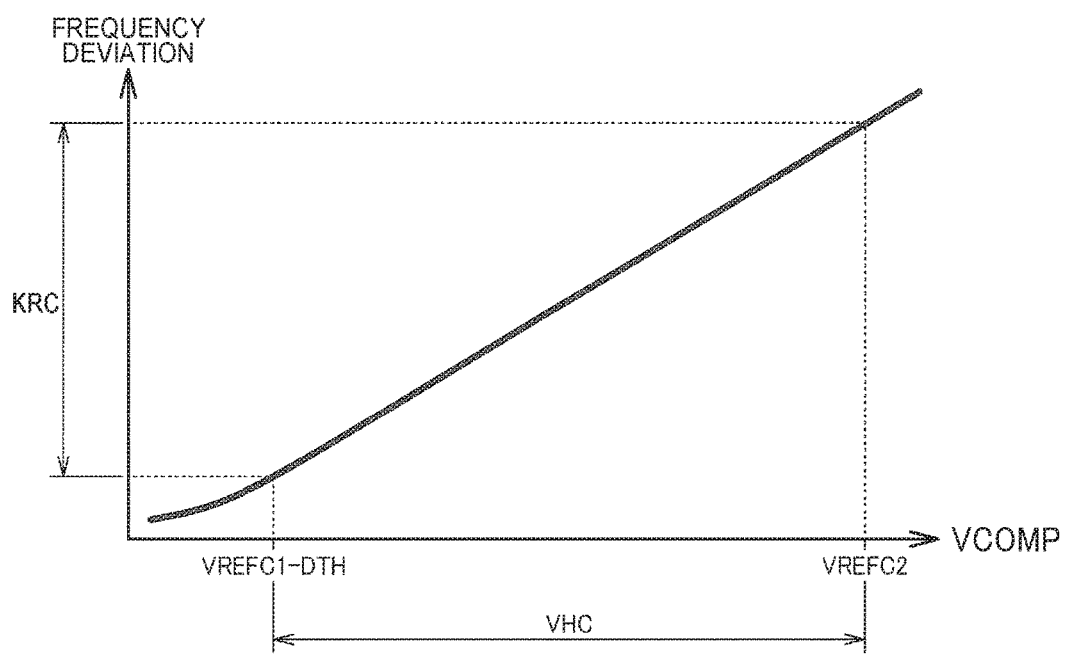
FIG. 14 illustrates a change characteristic of deviation of an oscillation frequency for a control voltage in the third configuration example.
Figure 15:
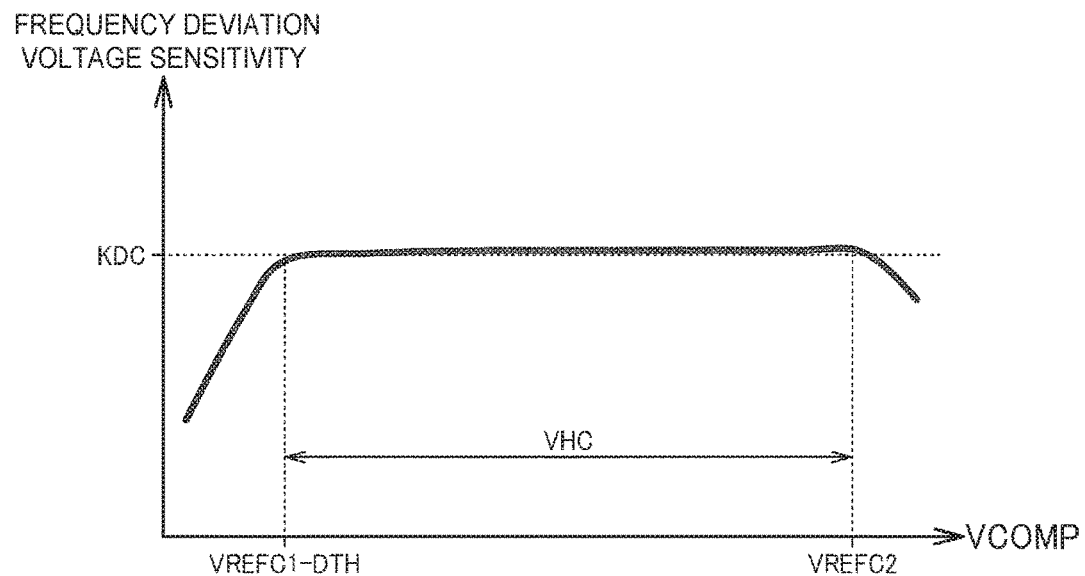
FIG. 15 illustrates a change characteristic of voltage sensitivity of frequency deviation for a control voltage in the third configuration example.

FIG. 14 illustrates a change characteristic of the frequency deviation of an oscillation frequency for the control voltage VCOMP in the third configuration example. In other words, the change characteristic is a change characteristic of the frequency deviation in a case where the change characteristic of the capacitance value in FIG. 13 is applied to the oscillation circuit 10 in FIG. 12. FIG. 15 illustrates a change characteristic of voltage sensitivity of the frequency deviation for the control voltage VCOMP in the third configuration example. In other words, the change characteristic corresponds to an inclination (first derivative) of the change characteristic of the frequency deviation in FIG. 14.

In the present embodiment, it is possible to sufficiently secure a range VHC of the control voltage VCOMP causing a change characteristic of the frequency deviation to be linear (the voltage sensitivity is constant) by using the four variable capacitive elements VCC1, VCC2, VCC3 and VCC4 in which inflection point voltages in change characteristics of capacitance values for the control voltage VCOMP are different from each other. In other words, it is possible to sufficiently secure a change range HRC of the frequency deviation causing a change characteristic of the frequency deviation to be linear (the voltage sensitivity is constant). In FIG. 15, voltage sensitivity KDC of the frequency deviation in the range VHC of the control voltage VCOMP may be the same as, for example, KDA in FIG. 5 or KDB in FIG. 8. In other words, it is possible to secure a range in which a change characteristic of the frequency deviation is linear while the voltage sensitivity is maintained to be high.

4. Fourth Configuration Example of Oscillation Circuit

Figure 16:
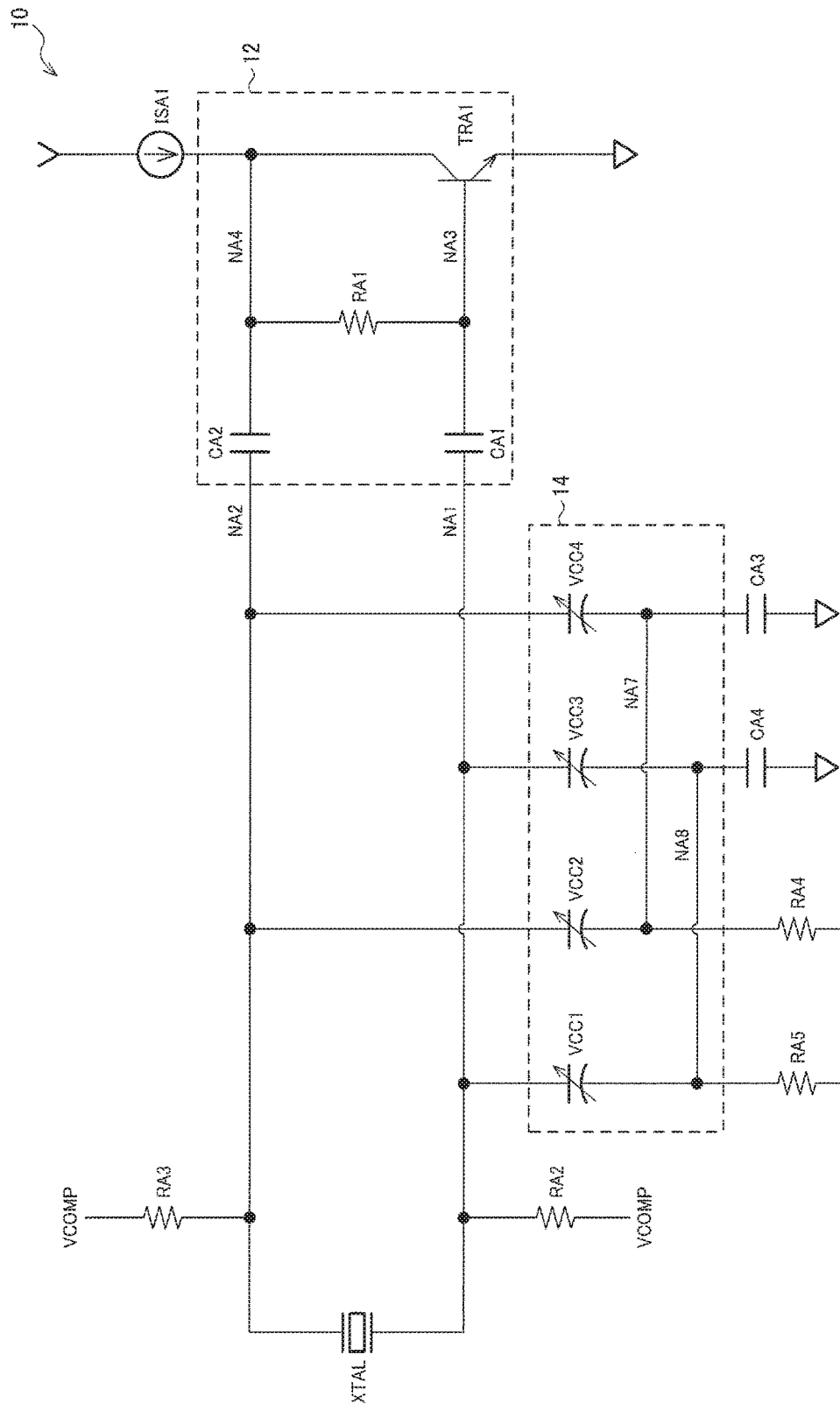
FIG. 16 illustrates a fourth configuration example of an oscillation circuit of the present embodiment.

FIG. 16 illustrates a fourth configuration example of the oscillation circuit 10 of the present embodiment. In the fourth configuration example, the control voltage VCOMP is supplied to one node NA1 and the other node NA2 (one ends of the variable capacitive elements VCC1, VCC2, VCC3 and VCC4) of the resonator XTAL. The reference voltage VREFC1 is supplied to the other ends of the variable capacitive elements VCC1 and VCC3, and the reference voltage VREFC2 is supplied to the other ends of the variable capacitive elements VCC2 and VCC4.

Specifically, the variable capacitive element VCC1 has one end connected to a node NA8 and the other end connected to the node NA1. The variable capacitive element VCC2 has one end connected to a node NA7 and the other end connected to the node NA2. The variable capacitive element VCC3 has one end connected to the node NA8 and the other end connected to the node NA1. The variable capacitive element VCC4 has one end connected to the node NA7 and the other end connected to the node NA2. The node NA8 is connected to one end of the resistive element RA5 and one end of the capacitor CA4, the other end of the resistive element RA5 is connected to the node of the reference voltage VREFC1, and the other end of the capacitor CA4 is connected to the node of the low potential side power source VSS. The node NA7 is connected to one end of the resistive element RA4 and one end of the capacitor CA3, the other end of the resistive element RA4 is connected to the node of the reference voltage VREFC2, and the other end of the capacitor CA3 is connected to the node of the low potential side power source VSS.

Figure 17:
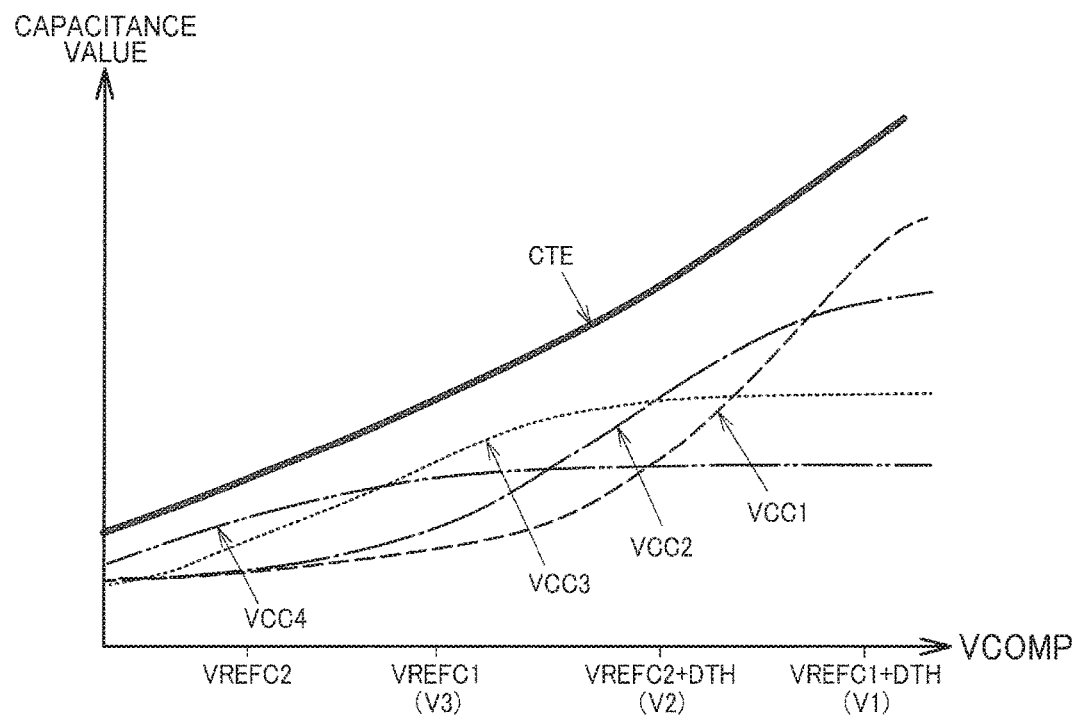
FIG. 17 illustrates a change characteristic of a capacitance value of a variable capacitive element for a control voltage in the fourth configuration example.

FIG. 17 illustrates change characteristics of capacitance values of the variable capacitive elements VCC1, VCC2, VCC3 and VCC4 for the control voltage VCOMP in the fourth configuration example.

As illustrated in FIG. 17, in the fourth configuration example, change characteristics of capacitance values of the variable capacitive elements VCC1, VCC2, VCC3 and VCC4 for the control voltage VCOMP are characteristics reverse to those in the third configuration example. Specifically, inflection point voltages in change characteristics of capacitance values for the control voltage VCOMP have a relationship of the first voltage (V1=VREFC1+DTH)>the second voltage (V2=VREFC2+DTH)>the third voltage (V3=VREFC1)>the fourth voltage (VREFC2). A relationship of a capacitance value of the variable capacitive element VCC1 at the first voltage>a capacitance value of the variable capacitive element VCC2 at the second voltage>a capacitance value of the variable capacitive element VCC3 at the third voltage>a capacitance value of the variable capacitive element VCC4 at the fourth voltage is satisfied.

The method according to the invention is also applicable to a case where connection of the variable capacitive elements (MOS capacitors) is reverse to that in the third configuration example. In other words, it is possible to sufficiently secure a range in which the frequency deviation changes linearly for the control voltage VCOMP.

5. Variable Capacitance Circuit

Figure 18:
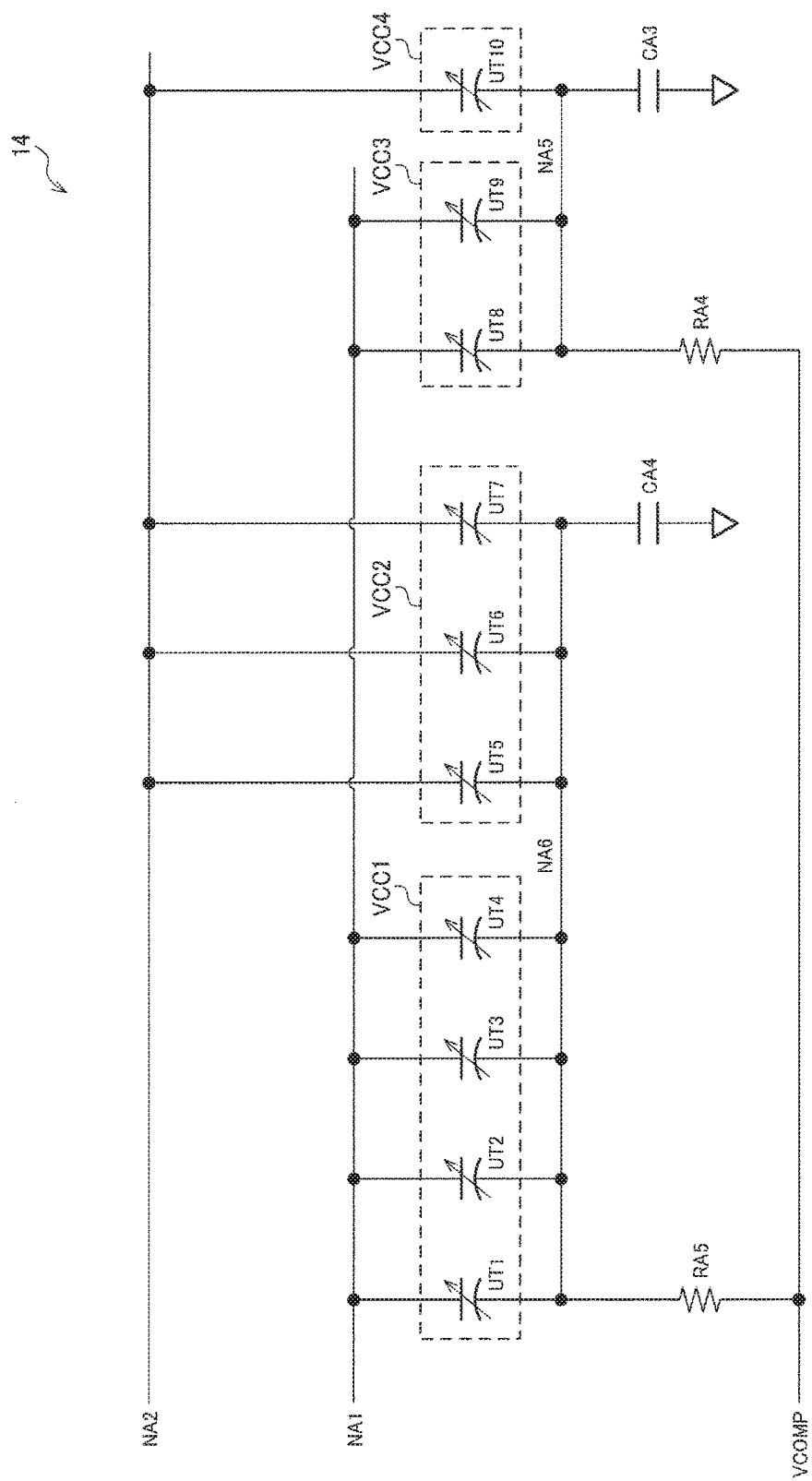
FIG. 18 illustrates a detailed configuration example of a variable capacitance circuit in a case where a variable capacitive element is formed of unit transistors.

FIG. 18 illustrates a detailed configuration example of the variable capacitance circuit 14 in a case where a variable capacitive element is formed of a unit transistor. In this detailed configuration example, the variable capacitive element VCC1 includes unit transistors UT1 to UT4, the variable capacitive element VCC2 includes unit transistors UT5 to UT7, the variable capacitive element VCC3 includes unit transistors UT8 and UT9, and the variable capacitive element VCC4 includes a unit transistor UT10.

The unit transistors UT1 to UT10 are MOS transistors having the same transistor size (gate size). Threshold voltages of the unit transistors UT1 to UT7 and the unit transistors UT8 to UT10 are different from each other by, for example, the above-described difference DTH in FIG. 10 or the like. Each unit transistor functions as a variable capacitive element, and capacitance values at inflection point voltages in change characteristics of capacitance values for a potential difference between both ends are the same (including substantially the same) as each other. In other words, in the example illustrated in FIG. 18, a ratio of capacitance values of the variable capacitive elements VCC1, VCC2, VCC3 and VCC4 at inflection point voltages is 4:3:2:1.

The variable capacitive element is not limited to a case of being formed of a unit transistor, and may be formed of a single transistor. In other words, the variable capacitive elements VCC1, VCC2, VCC3 and VCC4 may be formed of transistors having different transistor sizes.

6. Configuration Example of Circuit Device

Figure 19:
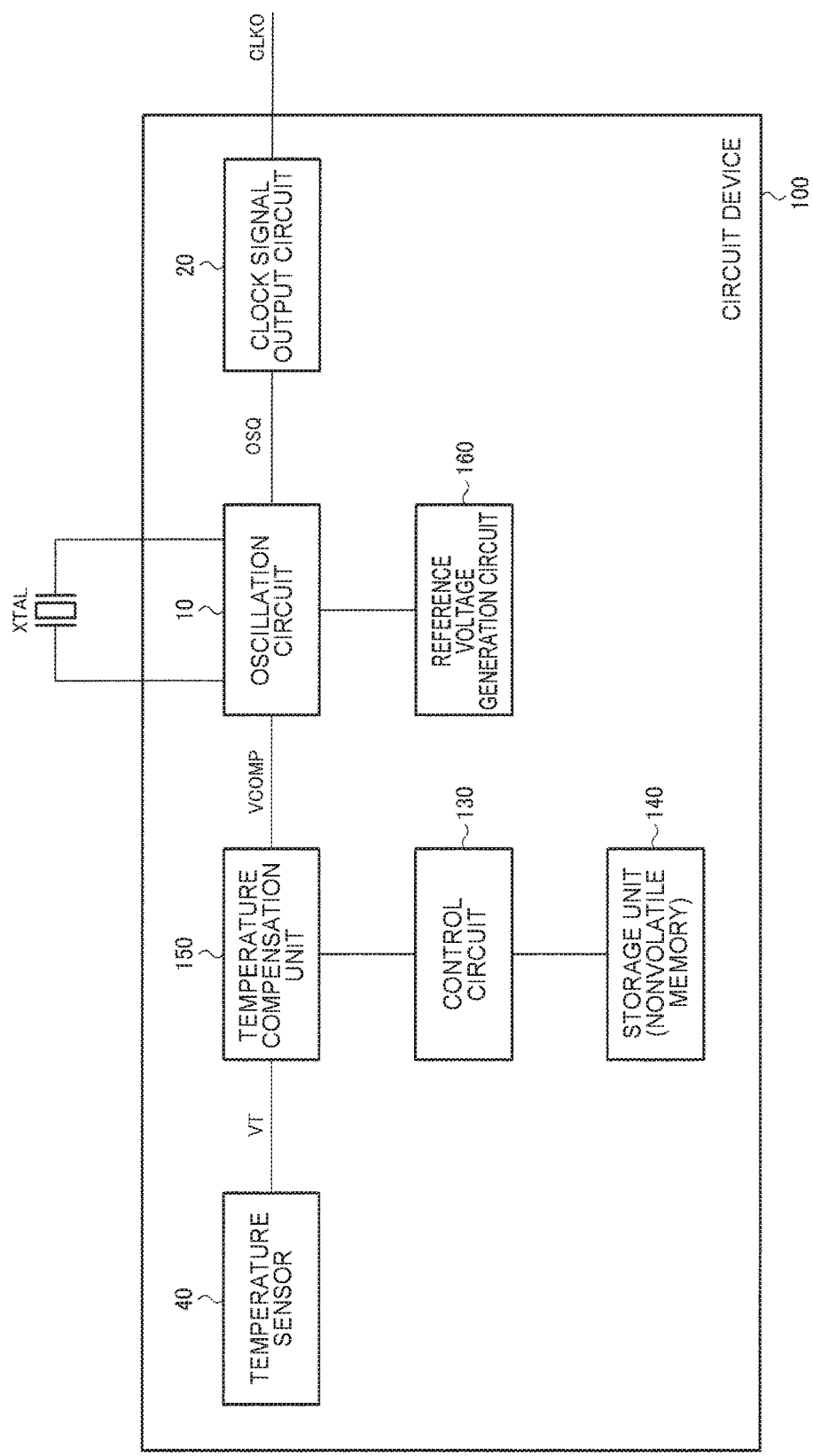
FIG. 19 illustrates a configuration example of a circuit device including an oscillation circuit of the present embodiment.

FIG. 19 illustrates a configuration example of a circuit device 100 including the oscillation circuit 10 of the present embodiment. The circuit device 100 includes a temperature sensor 40, a temperature compensation unit 150 (temperature compensation circuit), a control circuit 130, a storage unit 140 (nonvolatile memory), the oscillation circuit 10, a clock signal output circuit 20, and a reference voltage generation circuit 160. A configuration of the circuit device is not limited to the configuration illustrated in FIG. 19, and may be variously modified, for example, some of the constituent elements may be omitted (for example, the temperature sensor 40), or other constituent elements may be added thereto.

The oscillation circuit 10 is a circuit which generates an oscillation signal by using the resonator XTAL. Specifically, the oscillation circuit 10 is connected to the resonator XTAL via first and second resonator terminals (resonator pads). The oscillation circuit 10 causes the resonator XTAL to oscillate so as to generate an oscillation signal. In an oscillator such as a TCXO or an oven controlled crystal oscillator (OCXO), the control voltage VCOMP (temperature compensation voltage) corresponding to a detected temperature is input to the oscillation circuit 10, and the oscillation circuit 10 causes the resonator XTAL to oscillate at an oscillation frequency corresponding to the control voltage.

The resonator XTAL is a piezoelectric resonator such as a quartz crystal resonator. The resonator XTAL may be an oven type resonator (a resonator in an OCXO) provided in a thermostatic tank. Alternatively, the resonator XTAL may be a resonator (an electromechanical resonator or an electrical resonance circuit). As the resonator XTAL, a piezoelectric resonator, a surface acoustic wave (SAW) resonator, a micro electro mechanical systems (MEMS) resonator, or the like may be used. As a substrate material of the resonator XTAL, a piezoelectric single crystal of quartz crystal, Lithium Tantalate, or Lithium Niobate, a piezoelectric material such as piezoelectric ceramics of lead zirconate titanate or the like, or a silicon semiconductor material may be used. The resonator XTAL may be excited due to a piezoelectric effect, and may be excited by using electrostatic driving based on a Coulomb force.

The clock signal output circuit 20 outputs a clock signal CLKO on the basis of the output signal OSQ from the oscillation circuit 10. Specifically, the output signal OSQ or a signal obtained by dividing a frequency of the output signal OSQ is buffered (amplified for driving an external load), and the buffered signal is output as the clock signal CLKO.

The control circuit 130 controls each unit of the circuit device 100. The control circuit 130 performs an interface process with an external device (for example, a CPU) of the circuit device 100. The control circuit 130 is implemented by a logic circuit such as a gate array.

The storage unit 140 stores various pieces of information required for an operation of the circuit device 100. For example, information (coefficients of a polynomial for temperature compensation) required for the temperature compensation unit 150 to perform a temperature compensation process is stored. This information is written from an external device (for example, a test device), for example, during manufacturing of the circuit device 100 or manufacturing of an oscillator in which the circuit device 100 and the resonator XTAL are packaged.

The temperature compensation unit 150 generates the control voltage VCOMP (temperature compensation voltage) for realizing temperature compensation of an oscillation frequency in the oscillation circuit 10 on the basis of the temperature detection signal VT (temperature detection voltage) from the temperature sensor 40, and outputs the control voltage VCOMP to the oscillation circuit 10. For example, temperature characteristics of an oscillation frequency of the resonator XTAL are measured with a test device, and a third-order or fifth-order polynomial (approximate expression) for canceling (reducing a change in an oscillation frequency due to the temperature characteristics) the temperature characteristics is obtained. Coefficients of the polynomial are written in the storage unit 140. When the temperature compensation unit 150 performs temperature compensation, the control circuit 130 reads the coefficients of the polynomial from the storage unit 140, and outputs the coefficients to the temperature compensation unit 150. The temperature compensation unit 150 generates the control voltage VCOMP for canceling (reducing a change in an oscillation frequency due to the temperature characteristics) temperature characteristics of an oscillation frequency on the basis of the coefficients. For example, in a case of a third-order polynomial, the temperature compensation unit 150 includes a first-order component generation circuit generating a first-order component, a third-order component generation circuit generating a third-order component, a first-order component amplification circuit amplifying an output from the first-order component generation circuit, a third-order component amplification circuit amplifying an output from the third-order component generation circuit, and an addition circuit which adds outputs from the first-order and third-order component amplification circuits together so as to output the control voltage VCOMP.

The temperature sensor 40 is a sensor which detects a temperature of the circuit device 100 (semiconductor chip). For example, the temperature sensor 40 may be formed of a diode (PN junction) or the like. In this case, a temperature is detected by using temperature dependency of a forward voltage of the diode. In other words, the temperature detection signal VT is output on the basis of the forward voltage of the diode. The temperature sensor 40 is not limited thereto, and may employ various temperature sensors such as a thermistor. The invention also includes a configuration in which a temperature is detected on the basis of a difference between oscillation frequencies by using two oscillation circuits having different frequency-temperature characteristics. In this case, the oscillation circuits may be oscillation circuits using resonators, and may be ring oscillators or RC oscillation circuits. The oscillation circuit 10 for generating an oscillation signal may be used as one of the oscillation circuits.

The reference voltage generation circuit 160 is a circuit which generates various voltages (power source voltages and reference voltages) supplied to the respective units of the circuit device 100 on the basis of a power source voltage supplied from an external device of the circuit device 100. For example, the reference voltage generation circuit 160 supplies reference voltages (for example, VREFA1 and VREFA2 in FIG. 1) to the resonator XTAL. The reference voltage generation circuit 160 includes, for example, a bandgap reference circuit or a regulator.

In the above description, the analog temperature compensation type circuit device has been described as an example, but the invention is also applicable to a digital temperature compensation type circuit device. For example, the digital temperature compensation type circuit device includes a temperature sensor; an A/D conversion circuit which performs A/D conversion of converting a temperature detection signal from the temperature sensor into temperature detection data; a processing circuit which calculates control data (temperature compensation data) through digital signal processing based on the temperature detection data; a D/A conversion circuit which performs D/A conversion of converting the control data into a control voltage; an oscillation circuit (the oscillation circuit 10 of the present embodiment) which generates an oscillation signal by causing a resonator to oscillate at an oscillation frequency corresponding to the control voltage; and a clock signal output circuit which buffers the oscillation signal so as to output a clock signal.

7. Oscillator, Electronic Apparatus, and Vehicle

Figure 20:
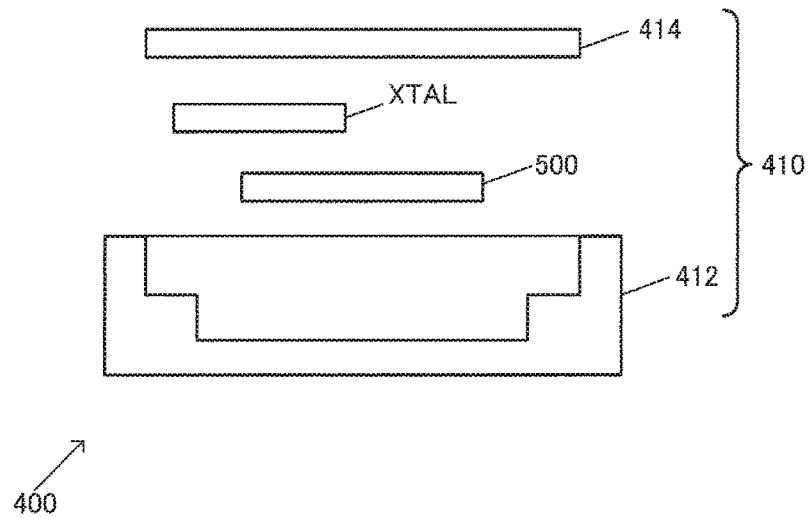
FIG. 20 illustrates a configuration example of an oscillator including the oscillation circuit of the present embodiment.

FIG. 20 illustrates a configuration example of an oscillator 400 provided with the oscillation circuit 10 of the present embodiment. The oscillator 400 includes a circuit device 500 (for example, the circuit device 100 in FIG. 19) and the resonator XTAL (a resonator or a resonator element). The oscillator 400 may include a package 410 in which the circuit device 500 and the resonator XTAL are accommodated. The circuit device 500 includes the oscillation circuit 10 (not illustrated) of the present embodiment. A configuration of the oscillator is not limited to the configuration illustrated in FIG. 20, and may be variously modified by omitting some constituent elements or adding other constituent elements thereto.

The package 410 is formed of, for example, a base portion 412 and a lid portion 414. The base portion 412 is, for example, a box-shaped member made of an insulating material such as ceramics, and the lid portion 414 is, for example, a tabular member joined to the base portion 412. External connection terminals (external electrodes) for connection to an external apparatus are provided on, for example, a bottom of the base portion 412. The circuit device 500, and the resonator XTAL are accommodated in an internal space (cavity) formed by the base portion 412 and the lid portion 414. The package 410 is sealed with the lid portion 414, and thus the circuit device 500 and the resonator XTAL are air-tightly enclosed therein. The circuit device 500 and the resonator XTAL are mounted in the package 410. Terminals of the resonator XTAL and terminals (pads) of the circuit device 500 (IC) are electrically connected to each other via internal wires of the package 410.

Figure 21:
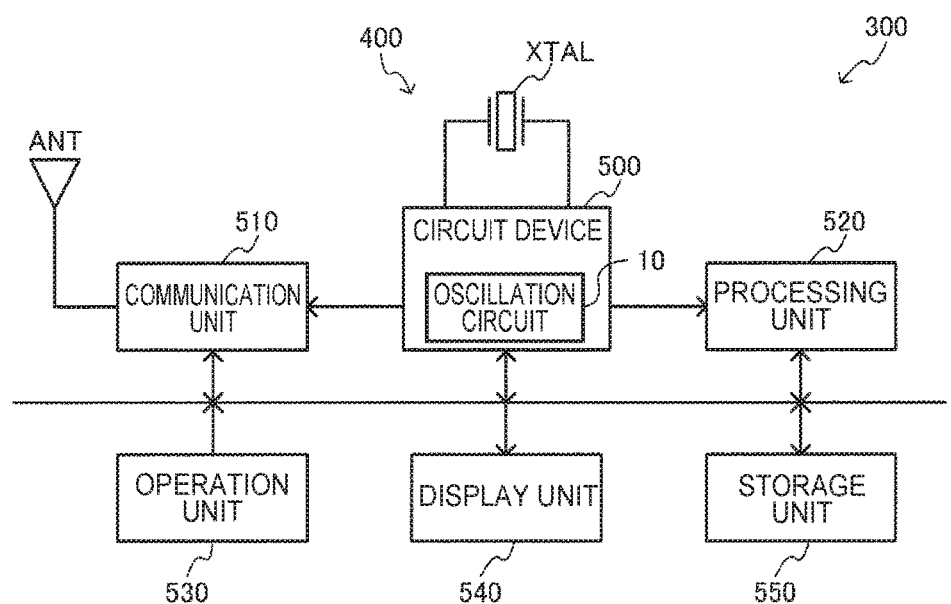
FIG. 21 illustrates a configuration example of an electronic apparatus including the oscillation circuit of the present embodiment.

FIG. 21 illustrates a configuration example of an electronic apparatus 300 including the oscillation circuit 10 of the present embodiment. The electronic apparatus 300 includes the circuit device 500, the resonator XTAL such as a quartz crystal resonator, an antenna ANT, a communication unit 510 (communication device), and a processing unit 520 (processing device). The electronic apparatus 300 may include an operation unit 530 (operation device), a display unit 540 (display device), and a storage unit 550 (memory). The oscillator 400 is formed of the resonator XTAL and the circuit device 500. The circuit device 500 includes the oscillation circuit 10 of the present embodiment. A configuration of the electronic apparatus 300 is not limited to the configuration illustrated in FIG. 21, and may be variously modified by omitting some constituent elements or adding other constituent elements thereto.

As the electronic apparatus 300 in FIG. 21, there may be various apparatuses, for example, a GPS built-in clock, a wearable apparatus such as a biological information measurement apparatus (a sphygmograph, a pedometer, or the like) or a head mounted display, a portable information terminal (mobile terminal) such as a smart phone, a mobile phone, a portable game apparatus, a notebook PC, or a tablet PC, a content providing terminal which delivers content, a video apparatus such as a digital camera or a video camera, or a network related apparatus such as a base station or a router.

The communication unit 510 (wireless circuit) performs a process of receiving data from an external apparatus or transmitting data to the external apparatus, via the antenna ANT. The processing unit 520 performs a process of controlling the electronic apparatus 300, or various digital processes on data which is transmitted and received via the communication unit 510. The function of the processing unit 520 may be realized by, for example, a processor such as a microcomputer. The operation unit 530 is used for a user to perform an input operation, and may be implemented by, for example, an operation button or a touch panel display. The display unit 540 displays various pieces of information, and may be implemented by, for example, a liquid crystal display or an organic EL display. In a case where a touch panel display is used as the operation unit 530, the touch panel display also functions as the operation unit 530 and the display unit 540. The storage unit 550 stores data, and a function thereof may be realized by a semiconductor memory such as a RAM or a ROM, or a hard disk drive (HDD).

Figure 22:
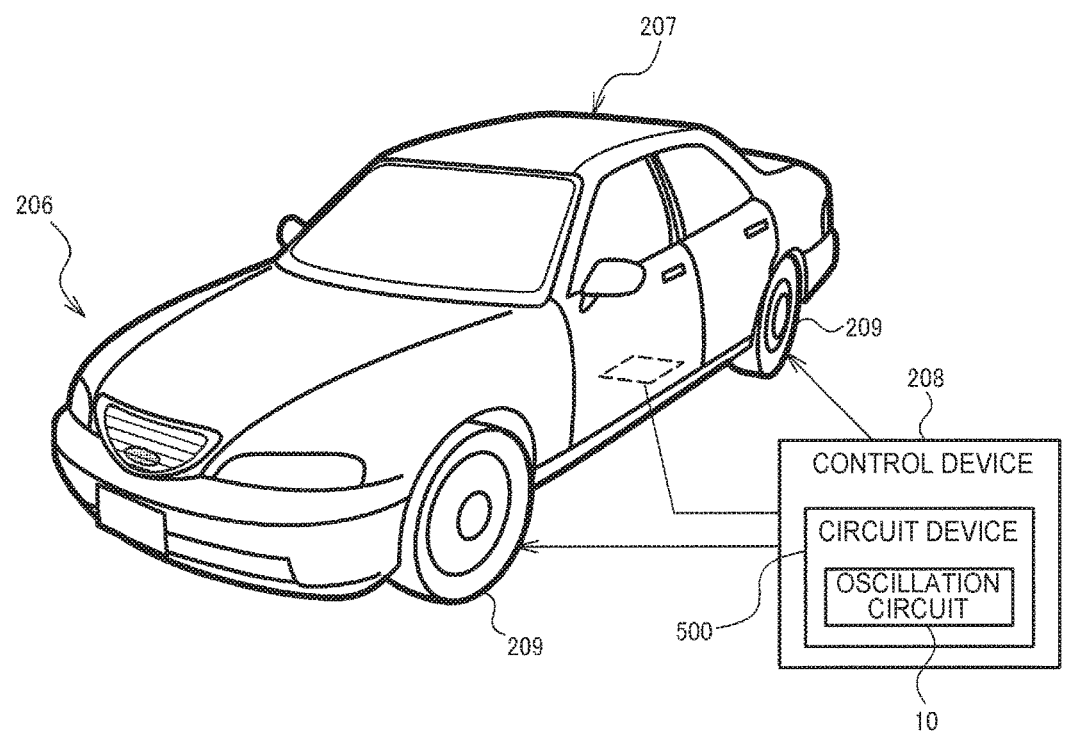
FIG. 22 illustrates a configuration example of a vehicle including the oscillation circuit of the present embodiment.

FIG. 22 illustrates an example of a vehicle including the oscillation circuit 10 of the present embodiment. The circuit device 500 (the oscillator) including the oscillation circuit 10 of the present embodiment may be incorporated into, for example, various vehicles such as a car, an aircraft, a motorbike, a bicycle, and a ship. The vehicles are pieces of equipment or instruments which are provided with, for example, driving mechanisms such as engines or motors, steering mechanisms such as handles or rudders, and various electronic apparatuses (on-vehicle apparatuses), and move on the ground, in the air, and in the sea. FIG. 22 schematically illustrates an automobile 206 as a specific example of the vehicle. The oscillator (not illustrated) including the circuit device and the resonator of the present embodiment is incorporated into the automobile 206. A control device 208 operates on the basis of a clock signal generated by the oscillator. The control device 208 controls hardness and softness of a suspension or a brake of each car wheel 209, for example, in accordance with the attitude of a car body 207. For example, automatic driving of the automobile 206 may be realized by the control device 208. An apparatus into which the circuit device or the oscillator of the present embodiment is incorporated is not limited to the control device 208, and the circuit device or the oscillator of the present embodiment may be incorporated into various apparatuses (on-vehicle apparatuses) provided in a vehicle such as the automobile 206.

Although the present embodiment has been described as above in detail, it can be easily understood by a person skilled in the art that various modifications without substantially departing from the new matters and effects of the invention are possible. Therefore, these modifications are all included in the scope of the invention. For example, in the specification or the drawings, the terminologies which are mentioned at least once along with different terminologies which have broader meanings or the same meanings may be replaced with the different terminologies in any location of the specification or the drawings. All combinations of the present embodiment and the modification examples are included in the scope of the invention. In addition, configurations, operations, and the like of the oscillation circuit, the circuit device, the oscillator, the electronic apparatus, and the vehicle are also not limited to the above description of the present embodiment, and may have various modifications.

The entire disclosure of Japanese Patent Application No. 2016-224883, filed Nov. 18, 2016 is expressly incorporated by reference herein.

What is claimed is:
1. An oscillation circuit comprising:
an amplification circuit configured to cause a resonator to oscillate; and
a variable capacitance circuit whose capacitance value is controlled based on a control voltage,
wherein the variable capacitance circuit includes:
a first variable capacitive element in which an inflection point voltage in a change characteristic of a capacitance value for the control voltage is a first voltage; and
a second variable capacitive element in which an inflection point voltage in a change characteristic of a capacitance value for the control voltage is a second voltage which is different from the first voltage,
wherein the capacitance value of the first variable capacitive element when the control voltage is the first voltage is different from the capacitance value of the second variable capacitive element when the control voltage is the second voltage, and
wherein the first variable capacitive element is configured with a first transistor having a first threshold voltage, and the second variable capacitive element is configured with a second transistor having a second threshold voltage which is different from the first threshold voltage.

2. The oscillation circuit according to claim 1,
wherein the first variable capacitive element is configured with n unit transistors including the first transistor, and the second variable capacitive element is configured with m unit transistors including the second transistor, and
the n is an integer of two or more, and the m is an integer of two or more and is different from the n.

3. A circuit device comprising:
the oscillation circuit according to claim 2;
a temperature sensor configured to detect a temperature; and
a controller configured to generate the control voltage corresponding to the detected temperature.

4. An oscillator comprising:
the oscillation circuit according to claim 2;
the resonator; and
a package housing the oscillation circuit and the resonator.

5. An electronic apparatus comprising:
the oscillation circuit according to claim 2; and
a communication device configured to receive a signal from the oscillation circuit so as to receive and transmit date from and to an external device.

6. The oscillation circuit according to claim 1,
wherein the first transistor of the first variable capacitive element has a first transistor size, and the second transistor of the second variable capacitive element has a second transistor size which is different from the first transistor size.

7. The oscillation circuit according to claim 2,
wherein, in each of the first variable capacitive element and the second variable capacitive element, the control voltage is supplied to one of a first node and a second node, and a reference voltage is supplied to the other of the first node and the second node, and
the first rode is a gate node, and the second node is a node of a source and a drain.

8. The oscillation circuit according to claim 1,
wherein the first variable capacitive element has first and second ends, the control voltage is supplied to the first end, and a first reference voltage is supplied to the second end,
wherein the second variable capacitive element has third and fourth ends, the control voltage is supplied to the third end, and a second reference voltage is supplied to the fourth end, and
the second a reference voltage is different from the first reference voltage.

9. The oscillation circuit according to claim 1,
wherein the first variable capacitive element has a first potential difference-capacitance value characteristic which is a change characteristic of a capacitance value for a potential difference between one end and the other end thereof,
wherein the second variable capacitive element has a second potential difference-capacitance value characteristic which is a change characteristic of a capacitance value for a potential difference between one end and the other end thereof, and
the second potential difference-capacitance value characteristic is different from the first potential difference-capacitance value characteristic.

10. The oscillation circuit according to claim 1,
wherein the variable capacitance circuit further includes a third variable capacitive element in which a change in a capacitance value occurs at an inflection point when the control voltage is a third voltage which is different from the first voltage and the second voltage.

11. The oscillation circuit according to claim 10,
wherein the first variable capacitive element is provided at an input node of the amplification circuit, the second variable capacitive element is provided at an output node of the amplification circuit, and the third variable capacitive element is provided at one of the input node and the output node of the amplification circuit.

12. The oscillation circuit according to claim 10,
wherein each of the first variable capacitive element and the second variable capacitive element has a first potential difference-capacitance value characteristic which is a change characteristic of a capacitance value for a potential difference between one end and the other end thereof,
the capacitance value of the first variable capacitive element is controlled based on a difference between a first reference voltage and the control voltage,
the capacitance value of the second variable capacitive element is controlled based on a difference between the control voltage and a second reference voltage which is different from the first reference voltage, and
wherein the third variable capacitive element has a second potential difference-capacitance value characteristic which is a chance characteristic of a capacitance value for a potential difference between one end and the other end thereof, and the second potential difference-capacitance value characteristic is different from the first potential difference-capacitance value characteristic.

13. The oscillation circuit according to claim 10,
wherein the variable capacitance circuit further includes a fourth variable capacitive element in which a change in a capacitance value occurs at an inflection point when the control voltage is a fourth voltage which is different from the first voltage, the second voltage, and the third voltage.

14. A circuit device comprising:
the oscillation circuit according to claim 1;
a temperature sensor configured to detect a temperature; and
a controller configured to generate the control voltage corresponding to the detected temperature.

15. An oscillator comprising:
the oscillation circuit according to claim 1;
the resonator; and
a package housing the oscillation circuit and the resonator.

16. An electronic apparatus comprising:
the oscillation circuit according to claim 1; and
a communication device configured to receive a signal from the oscillation circuit so as to receive and transmit date from and to an external device.

17. A vehicle comprising
the oscillation circuit according to claim 1; and
a controller configured to operate based on a clock signal from the oscillation circuit.

18. An oscillation circuit comprising:
an amplification circuit configured to cause a resonator to oscillate; and
a variable capacitance circuit,
wherein the variable capacitance circuit includes:
   a first variable capacitive element that has a first potential difference-capacitance value characteristic and is provided at an input node of the amplification circuit and whose capacitance value is controlled based on a difference between a control voltage and a first reference voltage,
   a second variable capacitive element that has the first potential difference-capacitance value characteristic and is provided at an output node of the amplification circuit and whose capacitance value is controlled based on a difference between the control voltage and a second reference voltage which is different from the first reference voltage; and
   a third variable capacitive element that has a second potential difference-capacitance value characteristic which is different from the first potential difference-capacitance value characteristic and is provided at one of the input node and the output node of the amplification circuit and whose capacitance value is controlled based on a difference between the control voltage and one of the first reference voltage and the second reference voltage, and
wherein, when the control voltage causing a change in a capacitance value of the first variable capacitive element to occur at an inflection point is indicated by V1, when the control voltage causing a change in a capacitance value of the second variable capacitive element to occur at an inflection point is indicated by V2, and when the control voltage causing a change in a capacitance value of the third variable capacitive element to occur at an inflection point is indicated by V3, a relationship of V1<V2<V3 is satisfied.

19. An oscillation circuit comprising:
an amplification circuit configured to cause a resonator to oscillate; and
a variable capacitance circuit,
wherein the variable capacitance circuit includes:
   a first variable capacitive element that has a first potential difference-capacitance value characteristic and is provided at an input node of the amplification circuit and whose capacitance value is controlled based on a difference between a control voltage and a first reference voltage;
   a second variable capacitive element that has the first potential difference-capacitance value characteristic and is provided at an output node of the amplification circuit and whose capacitance value is controlled based on a difference between the control voltage and a second reference voltage which is different from the first reference voltage; and
   a third variable capacitive element that has a second potential difference-capacitance value characteristic which is different from the first potential difference-capacitance value characteristic and is provided at one of the input node and the output node of the amplification circuit and whose capacitance value is controlled based on a difference between the control voltage and one of the first reference voltage and the second reference voltage, and
wherein, when the control voltage causing a change in a capacitance value of the first variable capacitive element to occur at an inflection point is indicated by V1, when the control voltage causing a change in a capacitance value of the second variable capacitive element to occur at an inflection point is indicated by V2, and when the control voltage causing a change in a capacitance value of the third variable capacitive element to occur at an inflection point is indicated by V3, a relationship of V1>V2>V3 is satisfied.

20. An oscillation circuit comprising:
an amplification circuit configured to cause a resonator to oscillate; and
a variable capacitance circuit whose capacitance value is controlled based on a control voltage,
wherein the variable capacitance circuit includes:
   a first variable capacitive element in which an inflection point voltage in a change characteristic of a capacitance value for the control voltage is a first voltage; and
   a second variable capacitive element in which an inflection point voltage in a change characteristic of a capacitance value for the control voltage is a second voltage which is different from the first voltage,
wherein the capacitance value of the first variable capacitive element when the control voltage is the first voltage is different from the capacitance value of the second variable capacitive element when the control voltage is the second voltage, and
wherein the first variable capacitive element is configured with n unit transistors, the second variable capacitive element is configured with m unit transistors, and the n is an integer of two or more, and the m is an integer of two or more and is different from the n.

21. An oscillation circuit comprising:
an amplification circuit configured to cause a resonator to oscillate; and
a variable capacitance circuit whose capacitance value is controlled based on a control voltage,
wherein the variable capacitance circuit includes:
- a first variable capacitive element in which an inflection point voltage in a change characteristic of a capacitance value for the control voltage is a first voltage; and
- a second variable capacitive element in which an inflection point voltage in a change characteristic of a capacitance value for the control voltage is a second voltage which is different from the first voltage, wherein the capacitance value of the first variable capacitive element when the control voltage is the first voltage is different from the capacitance value of the second variable capacitive element when the control voltage is the second voltage, and
wherein the first variable capacitive element is configured with a transistor having a first transistor size, and the second variable capacitive element is configured with a transistor having a second transistor size which is different from the first transistor size.

22. An oscillation circuit comprising:
an amplification circuit configured to cause a resonator to oscillate; and
a variable capacitance circuit whose capacitance value is controlled based on a control voltage,
wherein the variable capacitance circuit includes:
- a first variable capacitive element in which an inflection point voltage in a change characteristic of a capacitance value for the control voltage is a first voltage; and
- a second variable capacitive element in which an inflection point voltage in a change characteristic of a capacitance value for the control voltage is a second voltage which is different from the first voltage, wherein the capacitance value of the first variable capacitive element when the control voltage is the first voltage is different from the capacitance value of the second variable capacitive element when the control voltage is the second voltage, and
wherein the first variable capacitive element has a first potential difference-capacitance value characteristic which is a change characteristic of a capacitance value for a potential difference between one end and the other end thereof,
the second variable capacitive element has a second potential difference-capacitance value characteristic which is a change characteristic of a capacitance value for a potential difference between one end and the other end thereof, and
the second potential difference-capacitance value characteristic is different from the first potential difference-capacitance value characteristic.

* * * * *